US009087171B2

(12) United States Patent (10) Patent No.: US 9,087,171 B2
Kitaura (45) Date of Patent: Jul. 21, 2015

(54) SEMICONDUCTOR DEVICE AND DESIGNING METHOD OF SEMICONDUCTOR DEVICE

(71) Applicant: FUJITSU SEMICONDUCTOR LIMITED, Yokohama-shi, Kanagawa (JP)

(72) Inventor: Tomoyasu Kitaura, Kawasaki (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 14/034,080

(22) Filed: Sep. 23, 2013

(65) Prior Publication Data

US 2014/0096101 A1 Apr. 3, 2014

(30) Foreign Application Priority Data

Oct. 1, 2012 (JP) ................... 2012-219592

(51) Int. Cl.
*G06F 17/50* (2006.01)
*G11C 5/06* (2006.01)
*G11C 29/12* (2006.01)

(52) U.S. Cl.
CPC .............. *G06F 17/5077* (2013.01); *G11C 5/06* (2013.01); *G11C 5/063* (2013.01); *G11C 29/1201* (2013.01); *H01L 2924/0002* (2013.01)

(58) Field of Classification Search
CPC ............ G06F 17/5045; G06F 17/5068; G06F 17/5077
USPC .......... 716/100, 106, 110–111, 115, 126, 130
See application file for complete search history.

(56) References Cited

U.S. PATENT DOCUMENTS

| 6,510,545 B1 * | 1/2003 | Yee et al. ................ 716/126 |
| 2008/0276213 A1 | 11/2008 | Aoki et al. |
| 2009/0212837 A1 * | 8/2009 | Katoh ..................... 327/261 |

FOREIGN PATENT DOCUMENTS

| JP | 2001-308189 A | 11/2001 |
| JP | 2003-158186 A | 5/2003 |
| JP | 2009-218526 A | 5/2003 |
| JP | 2009-200217 A | 9/2009 |
| WO | WO 2007/077623 A1 | 7/2007 |

OTHER PUBLICATIONS

Korean Office Action issued Oct. 20, 2014; Application No. 10-2013-0103324, with Englsih Translation.

* cited by examiner

*Primary Examiner* — Paul Dinh
(74) *Attorney, Agent, or Firm* — Arent Fox LLP

(57) ABSTRACT

A semiconductor device has: a first signal line formed in a first wiring layer formed on a semiconductor substrate, and disposed in a first direction; first and second shield lines formed in the first wiring layer, disposed on both sides of the first signal line in the first direction, and given a first fixed potential; and a plurality of third shield lines formed in a second wiring layer formed on the semiconductor substrate, disposed with a first wiring width and at a first wiring interval in a second direction almost orthogonal to the first direction in a manner to partially overlap with each of the first signal line and the first and second shield lines, and given the first fixed potential.

3 Claims, 22 Drawing Sheets

F I G. 1
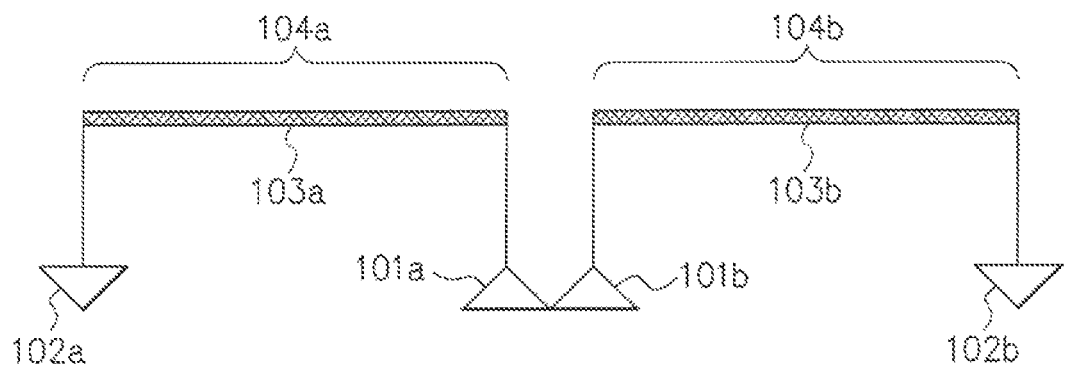
F I G. 2
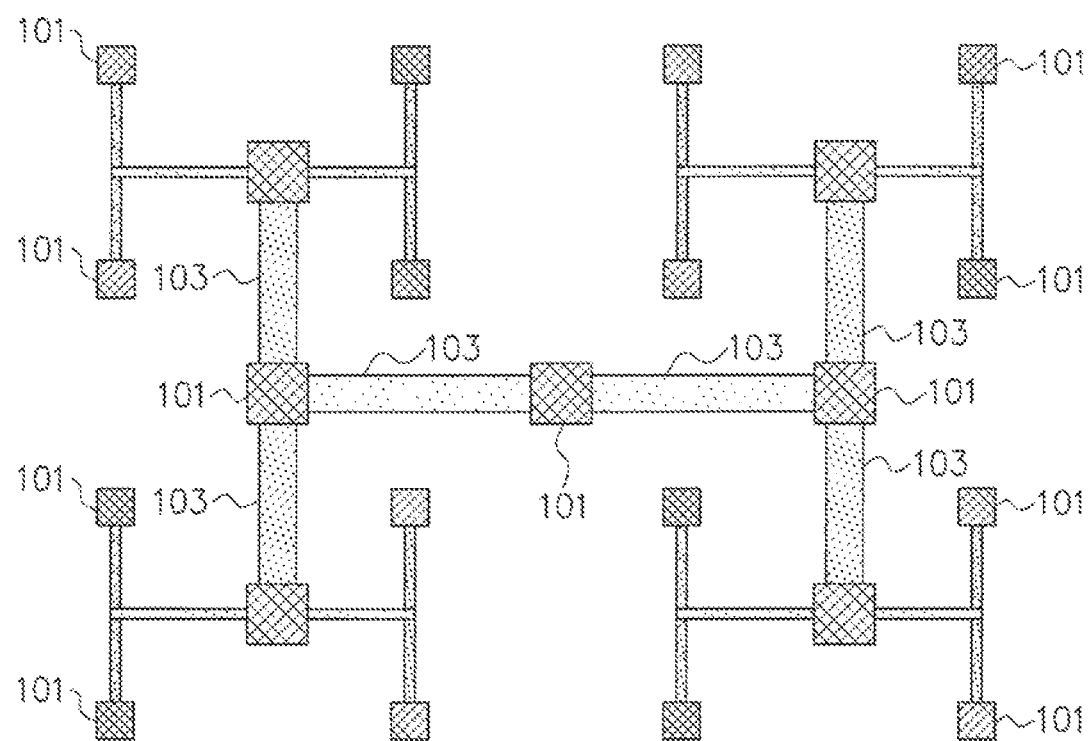

F I G. 5
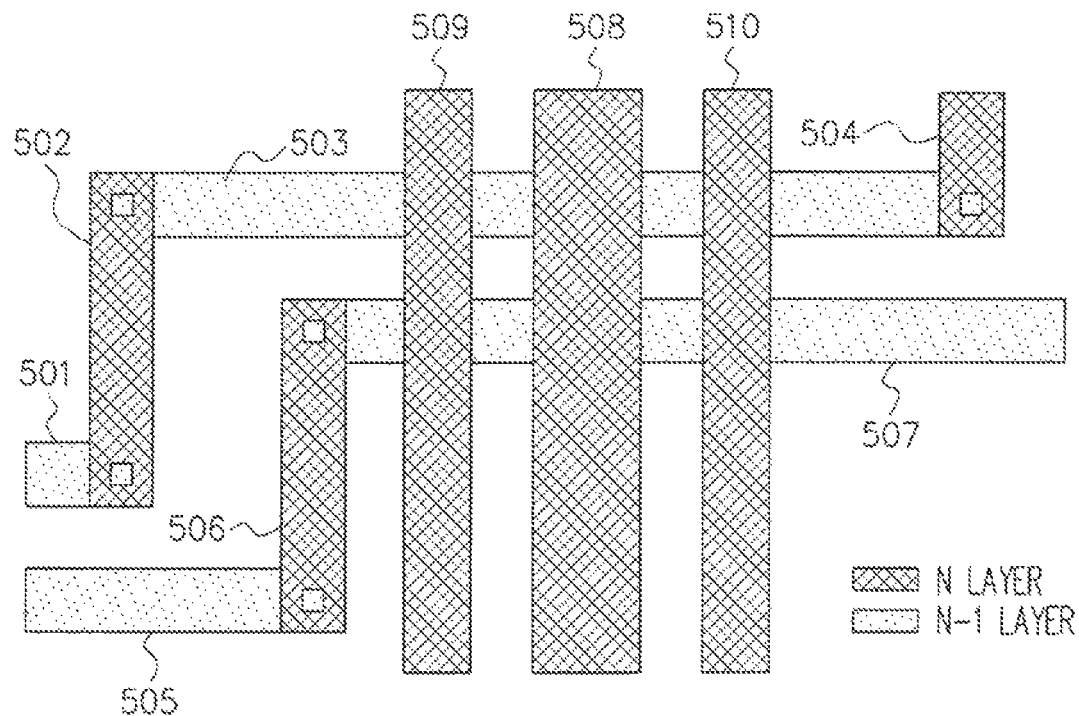
F I G. 6
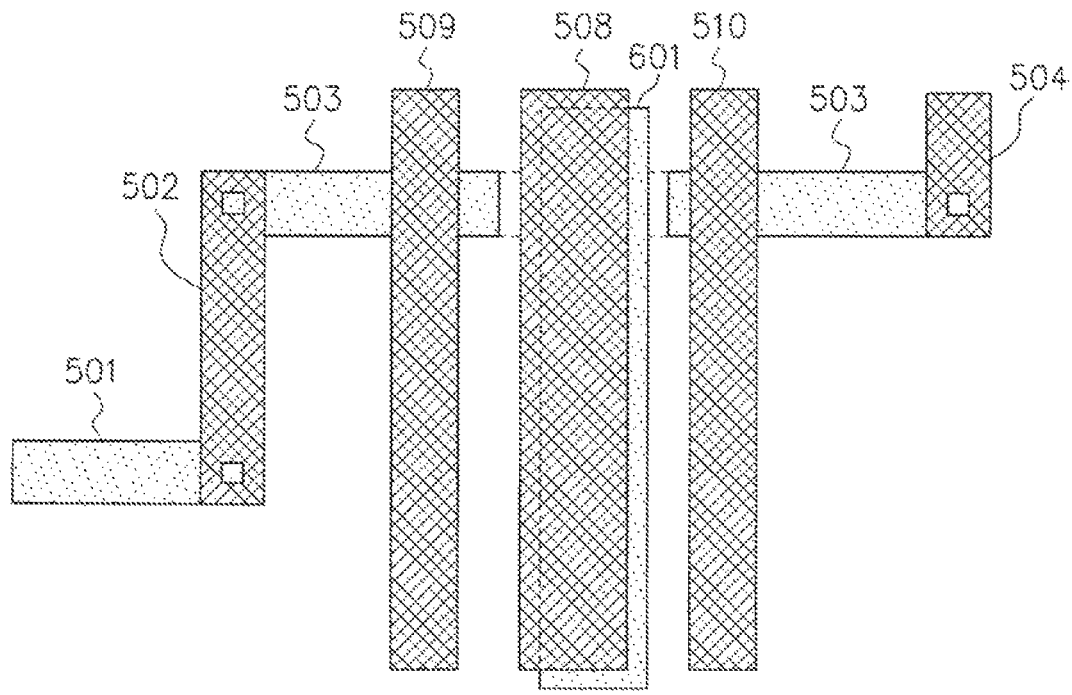

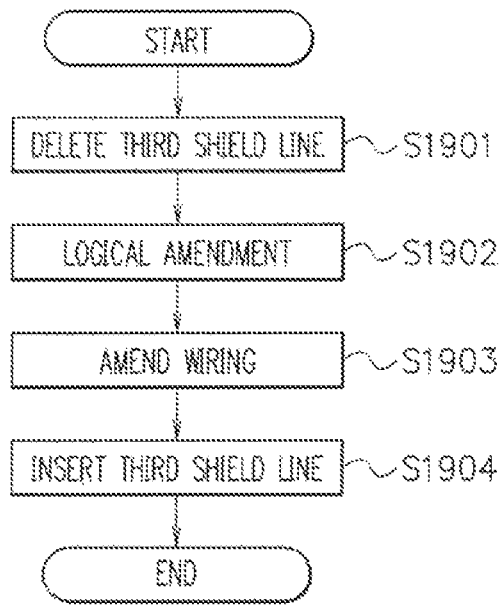
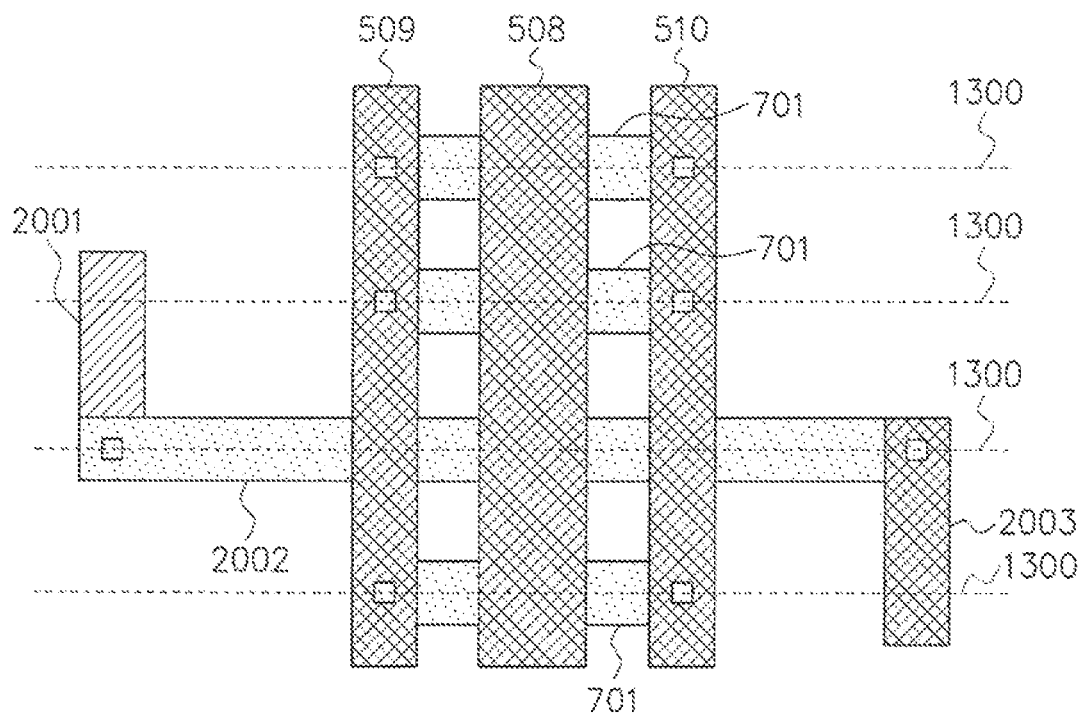

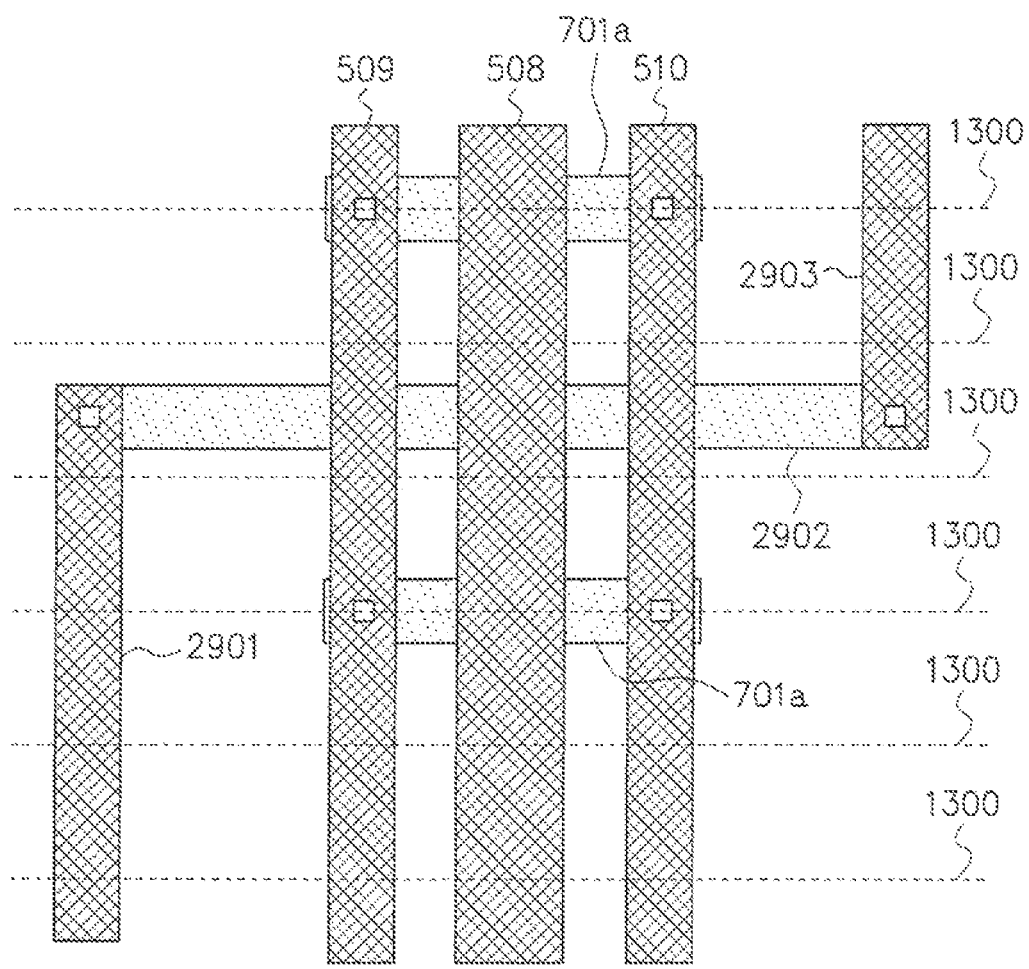
F I G. 29

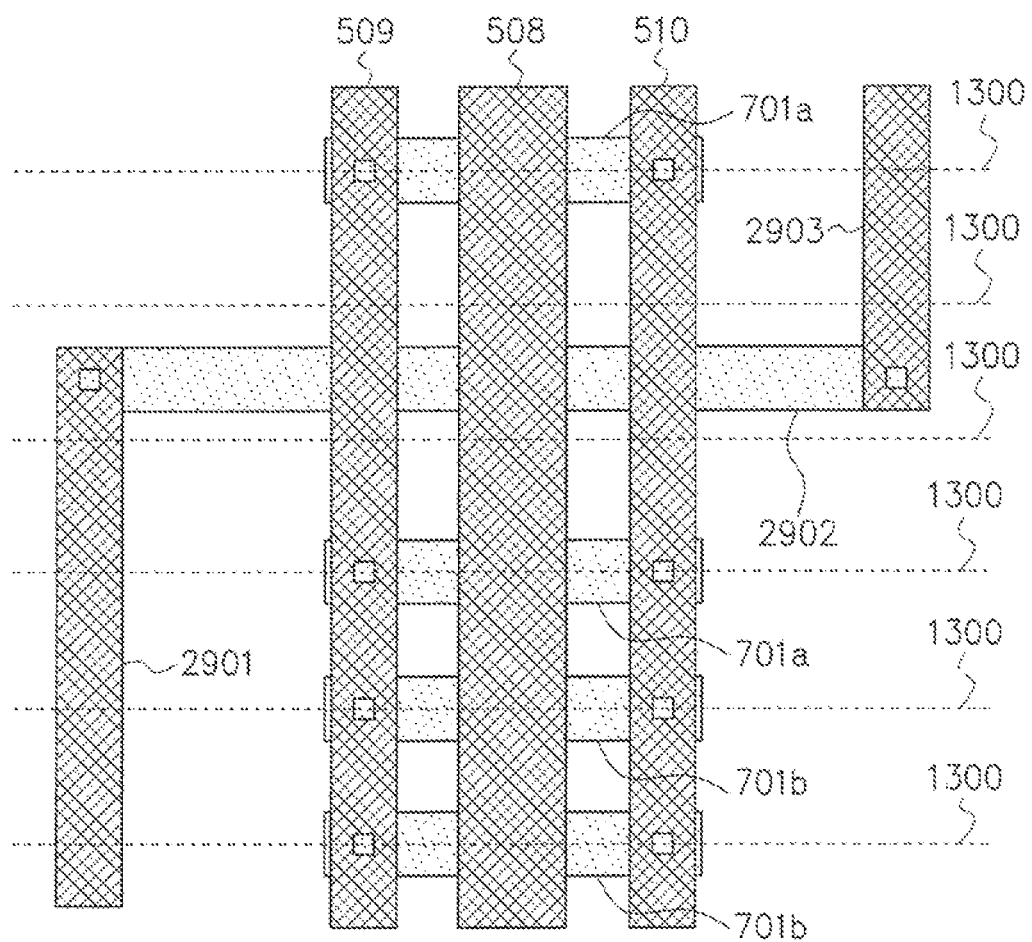
F I G. 30

F I G. 31
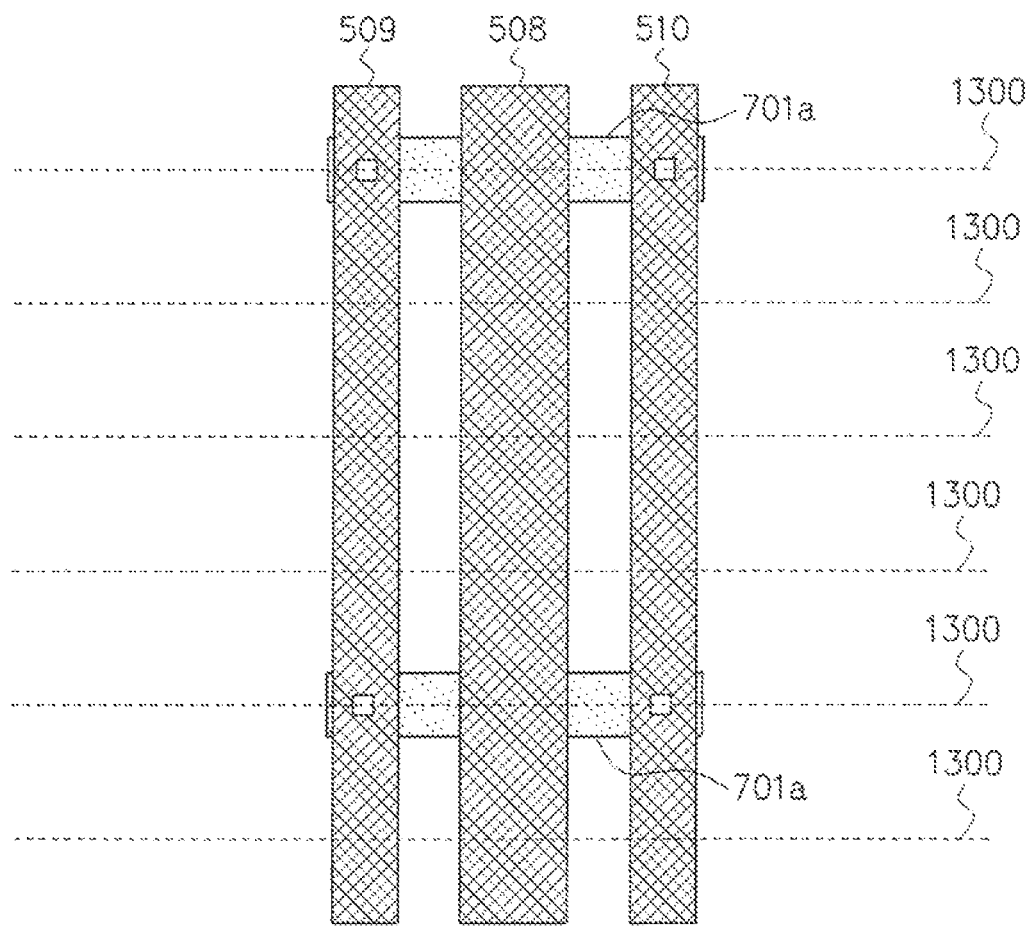

SEMICONDUCTOR DEVICE AND DESIGNING METHOD OF SEMICONDUCTOR DEVICE

CROSS-REFERENCE TO RELATED APPLICATION

This application is based upon and claims the benefit of priority of the prior Japanese Patent Application No. 2012-219592, filed on Oct. 1, 2012, the entire contents of which are incorporated herein by reference.

FIELD

The embodiments discussed herein are directed to a semiconductor device and a designing method of a semiconductor device.

BACKGROUND

There is known a semiconductor integrated circuit device which has a plurality of circuits that requires a clock signal (see Patent Document 1, for example). The semiconductor integrated circuit device is provided with a clock trunk line from a pulse generator and a clock driver, a power supply and a ground line, a shield wiring for clock trunk line, and a plurality of circuits. Further, the semiconductor integrated circuit device is provided with a connecting means in a region where a clock branch line and a shield wiring for clock branch line are provided and the shield wiring for clock branch line and either one of the power supply and the ground line intersect with each other, which connecting means connects the both depending on a judgment result obtained by judging whether or not each disposition relationship of components of the device fulfils a predetermined rule.

There is also known a clock wiring structure which includes: a clock wiring to propagate a clock signal which clock wiring is provided in a layer; a pair of same-layer shield wirings provided on both sides along the clock wiring in the layer; and an adjacent-layer wiring provided along the clock wiring and the pair of shield wirings in a lower layer and an upper layer of the layer or in either one of these layers (see Patent Document 2, for example).

Further, there is known a wiring structure which has: a clock wiring; a pair of first shield wirings provided on both sides along the clock wiring in the same layer as that of the clock wiring; and a second shield wiring provided in a manner to cover a region which faces the clock wiring and the pair of first shield wirings in a different layer from that of the clock wiring via an insulating layer (see Patent Document 3, for example). The wiring structure has an MIM capacitor in which a pair of electrodes are disposed to face via an insulating layer, and at least one of the pair of electrodes of the MIM capacitor is provided in the same layer as that of the second shield wiring.

(Patent Document 1) Japanese Laid-open Patent Publication No. 2001-308189
(Patent Document 2) Japanese Laid-open Patent Publication No. 2003-158186
(Patent Document 3) Japanese Laid-open Patent Publication No. 2009-218526

In a case where a plurality of clock signal lines are disposed and the same clock signal is distributed by a clock time, a lag occurs in timings of a plurality of distributed clock signals if capacitances of the plural clock lines are different, and a clock skew occurs.

SUMMARY

A semiconductor device has: a first signal line formed in a first wiring layer formed on a semiconductor substrate, and disposed in a first direction; first and second shield lines formed in the first wiring layer, disposed on both sides of the first signal line in the first direction, and given a first fixed potential; and a plurality of third shield lines formed in a second wiring layer formed on the semiconductor substrate, disposed with a first wiring width and at a first wiring interval in a second direction almost orthogonal to the first direction in a manner to partially overlap with each of the first signal line and the first and second shield lines, and given the first fixed potential.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1 is a diagram illustrating a configuration example of a clock tree;
FIG. 2 is a diagram illustrating an example of a clock tree by equal-length wirings of H-trees;
FIG. 5 is a plan view of a wiring layer illustrating an example of a semiconductor device which has a signal line and a shield line;
FIG. 5 is a diagram illustrating an example in which a shield line is provided for the semiconductor of FIG. 5;
FIG. 19 is a flowchart illustrating a processing example of a case where a result of timing violation is obtained from timing analysis of a semiconductor device of FIG. 20;
FIG. 20 is a plan view of a wiring layer.

FIG. 29 is a plan view of a wiring layer;
FIG. 30 is a plan view of a wiring layer;
FIG. 31 is a plan view of a wiring layer.

DESCRIPTION OF EMBODIMENTS

Figure 3:
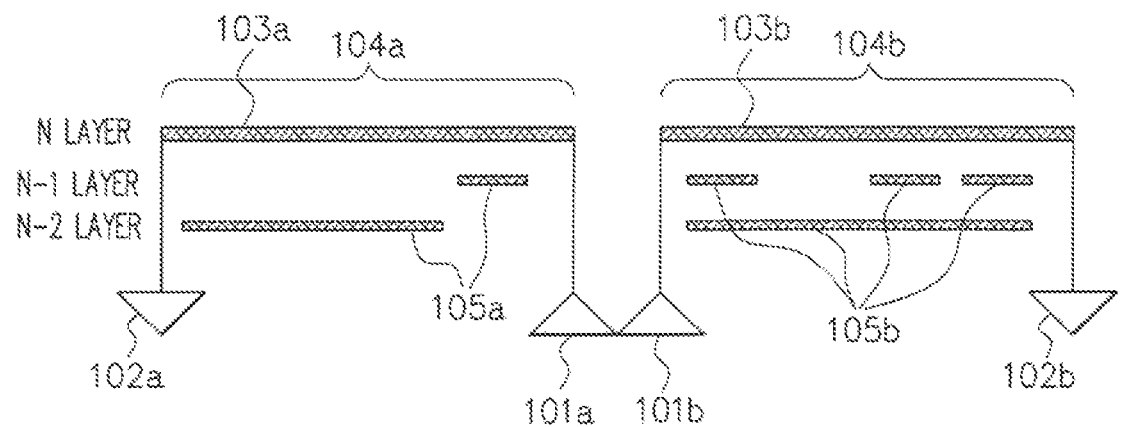
FIG. 3 is a cross-sectional view of a wiring layer illustrating an example of a wiring layer which includes a clock signal line.

FIG. 1 is a diagram illustrating a configuration example of a clock tree. Drivers 101a and 101b each amplify the same clock signal and output to receivers 102a and 102b via clock signal lines 103a and 103b. Thereby, the same clock signal can be distributed to a plurality of the receivers 102a and 102b. The distributed clock signal is used as a synchronous signal of a flip-flop or latch circuit. For example, the drivers 101a and 101b are buffers and the receivers 102a and 102b are flip-flop or latch circuits. On distributing the clock signal, it is necessary that, in synchronous designing, a difference (clock skew) between a clock arrival delay time from the deriver 101a to the receiver 102a and a clock arrival delay time from the driver 101b to the receiver 102b is made small.

However, the clock signal lines 102a and 103b have different junction capacitances with adjacent wirings in the same layer or upper/lower layer due to surrounding layout patterns, and thus a variation occurs in clock arrival delay times to the receivers 102a and 102b. Further, in a manufacturing process, a manufacturing variation in film thicknesses or wiring widths occurs due to surrounding patterns or the like, leading o occurrence of a variation in the clock arrival delay times.

In a static timing analysis (STA), a delay time is computed by being divided into components below.

delay time=(delay time of cell)+(delay time of wiring)+(cross talk delay time)

The delay time of cell is a function of an incline of an edge of an input waveform and a load capacitance of an output. The delay time of wiring is a function of a wiring resistance and a wiring capacitance (an earth capacitance and an inter-wiring capacitance). The cross talk delay time is a function of the inter-wiring capacitance and a driver strength.

Here, the delay time of cell of the clock signal line 102a is referred to a T1a, the delay time of cell of the cock signal line 103b is referred to as T1b, the delay time of wiring of the clock signal line 103a is referred to as T2a, the delay time of wiring of the clock signal line 103b is referred to as T2b, the cross talk delay time of the clock signal 102a is referred to as T3a, and the cross talk delay time of the clock signal line 103b is referred to as T3b. At that time, a skew between the clock signal lines 102a and 103b is represented by a formula below.

skew=(difference in delay times of cell)+(difference in delay times of wiring)+(difference in cross talk delay times)

=(T1a−T1b)+(T1a−T2b)+(T3a−T3b)

Therefore, by making the difference in the delay times of respective elements smaller, the skew can be made smaller.

Logically, by making a length 104a of the clock signal line 103a and a length 104b of the clock signal line 103b equal, resistances and capacitances of the clock signal lines 103a and 103b become equal, and the skew can be reduced.

FIG. 2 is a diagram illustrating an example of a clock tree by equal-length wirings of H-trees. The H-tree is constituted by a plurality of drivers 101 and a clock signal line 103. A clock signal is transmitted from the driver 101 of a center and distributed into a plurality of clock signals. By making wiring topologies equal and making correspondent clock signal lines 103 equal in lengths, a clock skew can be made smaller. Thereby, differences in the wiring resistances and capacitances of respective clock signal lines 103 become smaller, a difference in wiring delay times and a difference in cell delay times are improved, and the clock skew is improved. Resistance values of the wiring resistances can be made almost uniform, except a manufacturing variation, by making wiring patterns uniform.

FIG. 3, corresponding to FIG. 1, is a cross-sectional view of a wiring layer illustrating an example of a wiring layer which includes the clock signal line. The clock signal lines 103a and 103b are provided in N layers. An N−1 layer is a layer below the N layer. An N−2 layer is a layer below the N−1 layer. The N−1 layer and the N−2 layer below the clock signal line 103a are provided with signal lines 105a. The N−1 layer and the N−2 layer below the clock signal line 103b are provided with signal lines 105b. A pattern of the signal line 105a is different from a pattern of the signal line 105b. Therefore, an inter-wiring capacitance between the clock signal line 103a and the signal line 105a and an inter-wiring capacitance between the clock signal line 103b and the signal line 105b are different from each other, so that a skew between the clock signal lines 103a and 103b occurs. Thus, in order to reduce the skew, it is desirable that the pattern of the signal line 105a and the pattern of the signal line 105b become equal.

Figure 4:
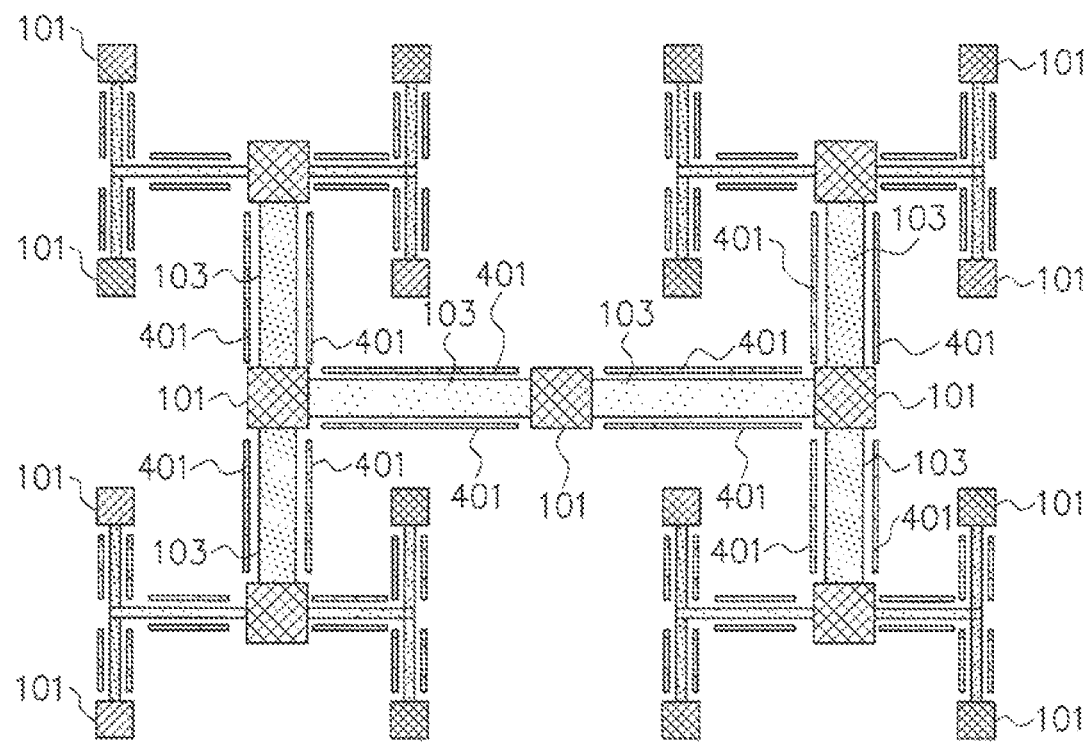
FIG. 4 is a diagram illustrating side shield lines provided in H-trees.

FIG. 4 is a diagram illustrating side shield lines 401 provided in H-trees (FIG. 2). As a result that the shield lines 401 are provided for the clock signal line 103 on both sides of the clock signal line 103 in the same layer, a capacitance generated in the same layer is made uniform and at the same time a cross talk can be reduced.

Figure 8:
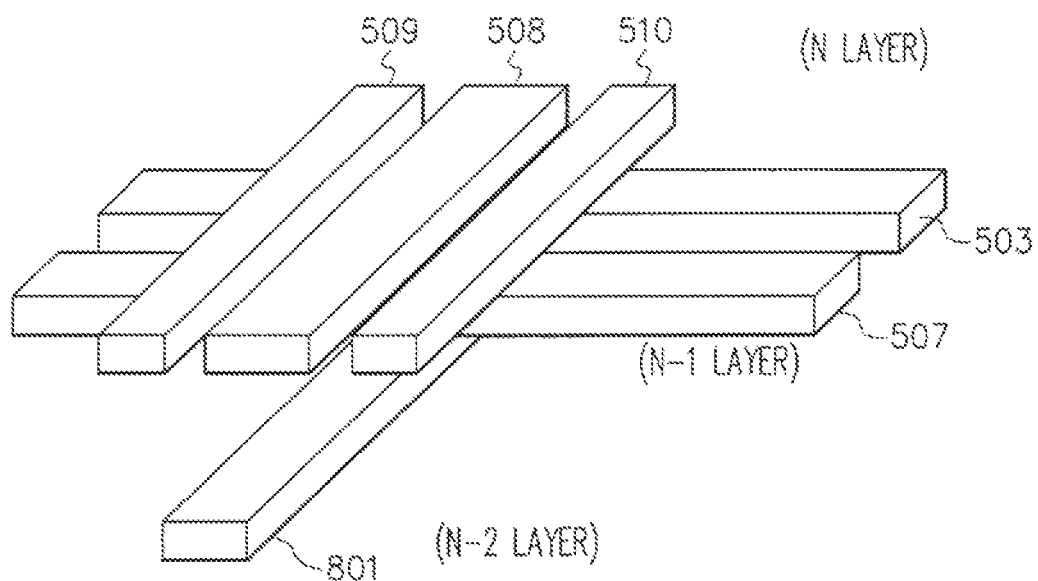
FIG. 8 is a perspective view of the wiring layer of the semiconductor device of FIG. 5.

FIG. 5 is a plan view of a wiring layer illustrating an example of a semiconductor device which has a signal line and a shield line, and FIG. 8 is a perspective view of the wiring layer of the semiconductor device of FIG. 5. A second wiring layer (N−1 layer) is a wiring layer below a first wiring layer (N layer) and a third wiring layer (N−2 layer) is a wiring layer below the second wiring layer (N−1 layer). The first to third wiring layers are each separated by insulating layers.

A first signal line 508 is formed in the first wiring layer (N layer) formed on a semiconductor substrate and is disposed in a first direction (vertical direction of the drawing). A first shield line 509 and a second shield line 510 are formed in the first wiring layer (N layer) and are disposed on both sides of the first signal line 508 in the first direction, and a first fixed potential) is given. By providing the shield line 509 and 510, a capacitance of the first signal line 508 is made to have a constant value and a skew is reduced similarly to in FIG. 4, so that cross talks from both sides of the first signal line 508 can be reduced.

The signal lines 501 to 504 are connected to each other by contacts (vias). The signal lines 502 and 504 are dispose din the first direction in the first wiring layer (N layer). The signal lines 501 and 502 are disposed in a second direction (horizontal direction of the drawing) in the second wiring layer (N−1 layer). The second direction is a direction almost orthogonal to the first direction.

Signal lines 505 to 507 are connected to each other by contacts (vias). The signal line 506 is disposed in the first direction in the first wiring layer (N layer). The signal lines 505 and 507 are disposed in the second direction in the second wiring layer (N−1 layer). A signal line 801 (FIG. 8) is disposed in the first direction in the third wiring layer (N−2 ).

In the first wiring layer (N layer), a priority wiring direction is the first direction and the wirings 502, 504, 506, 508 to 510 which extend along the first direction are provided. In the second wiring layer (N−1 layer), a priority wiring direction is the second direction and the wirings 501, 503, 505, and 507 which extend along the second direction are provided. In the third wiring layer (N−2 layer), a priority wiring direction is the first direction and the wiring 801 (FIG. 8) which extends along the first direction is provided. As described above, as the priority wiring directions of the first to third wiring layers, the first direction and the second direction are alternated in relation to an upper and a lower direction. For the wiring 501 to 510, aluminum is used in a top layer and copper is used in layers other than the top layer.

The second signal lines 503 and 507 are disposed in the second direction in the second wiring layer (N−1 layer) in a manner to partially overlap with each of the first signal line 508, the first shield line 509, and the second shield line 510.

FIG. 6 is a diagram illustrating an example in which a shield line 601 is provided for the semiconductor device of FIG. 5. As described above, in order to reduce the skew, it is preferable to make the pattern of the signal line 105a and the pattern of the signal line 105b of FIG. 3 equal to each other. Thus, it is preferable to provide the shield line 601 in the first direction the same as that of the first signal line 508, in the second wiring layer (N−1 layer) below the first signal line 508. However, in the second wiring layer (N−1 layer) the priority wiring direction is the second direction and the first direction of the shield line 601 is a non-priority wiring direction. Therefore, when the shield line 601 of the first direction being the non-priority wiring direction is provided in the second wiring layer (N−1 layer), the second signal line 503 of the second direction is cut off, causing a problem of substantial reduction of a wiring property.

Figure 7:
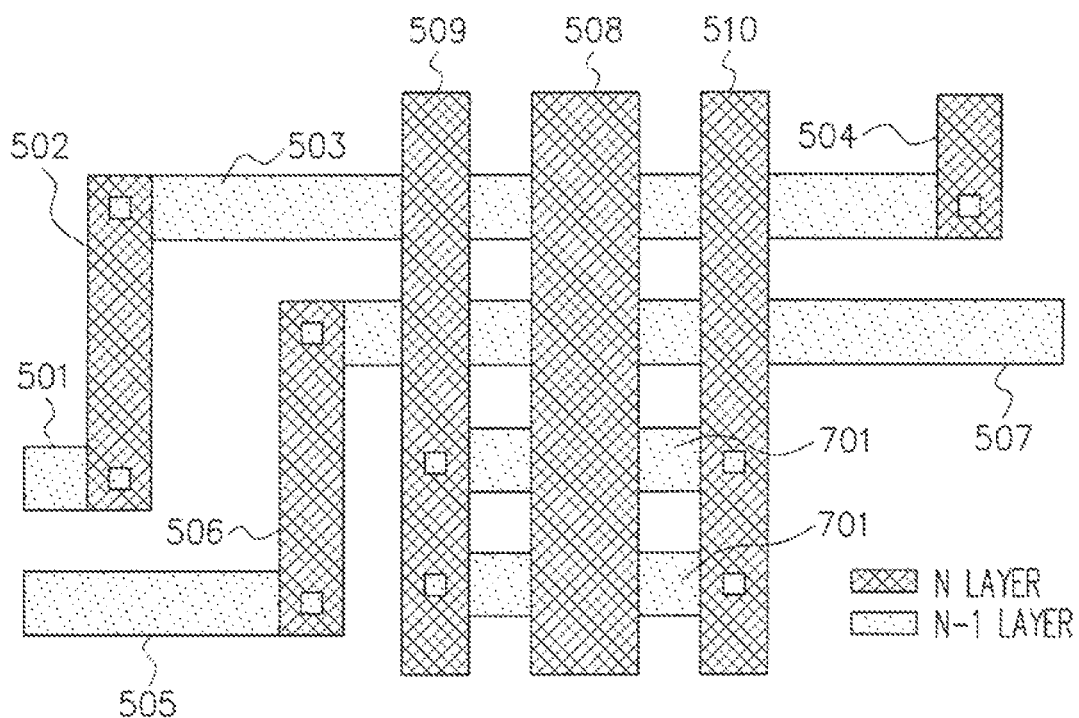
FIG. 7 is a plan view of a wiring layer in which a third shield line is provided for the semiconductor device of FIG. 5.
Figure 9:
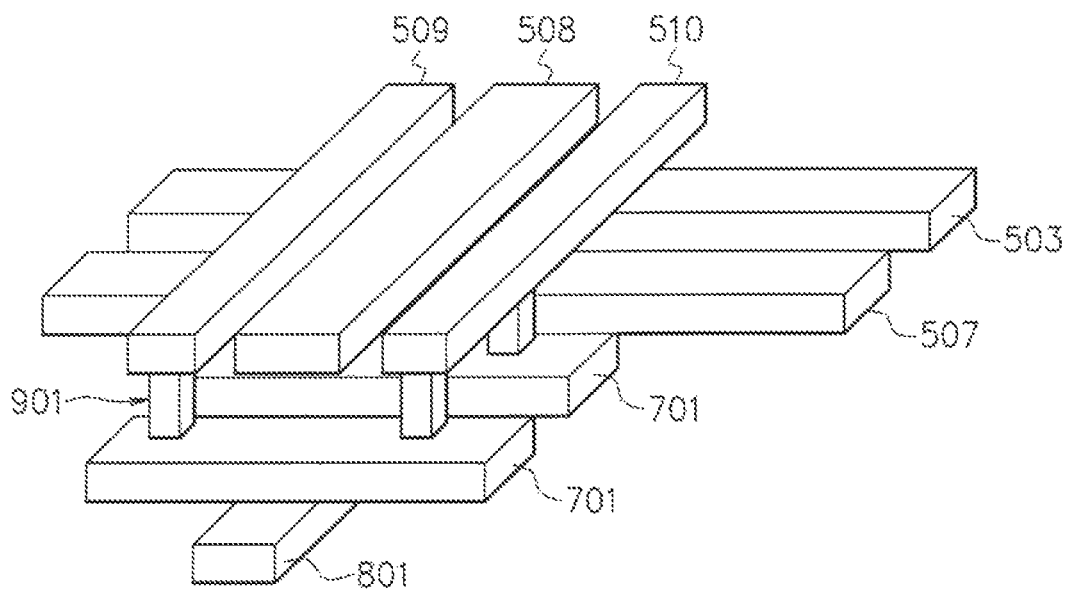
FIG. 9 is a perspective view of the wiring layer of the semiconductor device of FIG. 7.

FIG. 7 is a plan view of a wiring layer in which a third shield line 701 is provided for the semiconductor device of FIG. 5, and FIG. 9 is a perspective view of a wiring layer of a semiconductor device of FIG. 7, in which the third shield line 701 is added to the semiconductor device of FIG. 8. A plurality of the third shield lines 701 is formed in a second wiring layer (N−1 layer) formed on a semiconductor substrate, disposed with a first wiring width and at a first wiring interval in a second direction (horizontal direction of FIG. 7) almost orthogonal to a first direction in a manner to partially overlap with each of a first signal line 508, a first shield line 509, and a second shield line 510, and given a first fixed potential (a ground potential or a power supply potential). Further, the plural third shield lines 701 are connected to the first shied line 509 and/or the second shield line 510 by contacts (via) 901. In relation to the first signal line 508, the first shield line 509, the second shield line 510, the third shield lines 701, and second signal lines 503, 507 have a shape of a ladder. Since the third shield lines 701 and the second signal lines 503, 507 are disposed with the first wiring width and at the first wiring interval, a capacitance of the first signal line 508 can be made to have a constant value to reduce a skew, enabling reduction of a cross talk from a lower layer of the first signal line 508. In the second wiring layer (N−1 layer), as a result that the third shield lines 701 are added to a portion where neither the second signal lines 503 nor 507 exists, uniformity of wiring patterns can be maintained.

Figure 10:
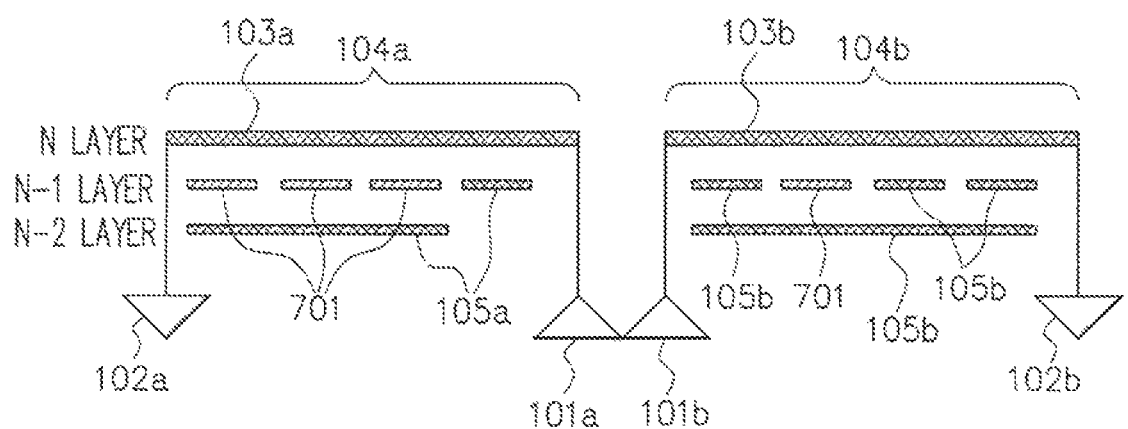
FIG. 10 is a cross-sectional view of a wiring layer in which a third shield line is added to the semiconductor device of FIG. 3.

FIG. 10 is a cross-sectional view of a wiring layer in which a third shield line 701 is added to the semiconductor device of FIG. 3, similarly to in FIG. 7 and FIG. 9. Clock signal lines 103a and 103b correspond to the first signal line 508 of FIG. 7 and FIG. 9.

In a second wiring layer (N−1 layer) below the clock signal line 103a, the third shield lines 701 and a signal line 105a are disposed with a first siring width and at a first wiring interval. By providing the third shield lines 701, the clock signal line 103a comes to have a capacitance of a constant value, so that a cross talk from a signal line 105a of a third wiring layer N−2 layer) can be reduced.

In a second wiring layer (N−1 layer) below the clock signal line 103b, the third shield line 701 and signal lines 501b are disposed with a first wiring width and at a first wiring interval. By providing the third shield line 701, the clock signal line 103b comes to have a capacitance of a constant value, so that a cross talk from a signal line 105b of a third wiring layer (N−2 layer) can be reduced.

Since a pattern of the wirings 105a, 701 of the second wiring layer (N−1 layer) below the clock signal line 103a becomes equal to a pattern of the wirings 501b, 701 of the second wiring layer (N−1 layer) below the clock signal line 103b, a capacitance of the clock wiring 103a and a capacitance of the clock wiring 103b become almost the same. Thereby, a delay time of the clock signal line 103a and a delay time of the clock signal line 103b become almost the same, so that a skew between the clock signals 103a and 103b can be reduced.

Note that in the above, the layer below the first signal line 508 is used as an example and explained, but a layer above the first signal line 509 is similar to the layer below the signal line 508.

Figure 11:
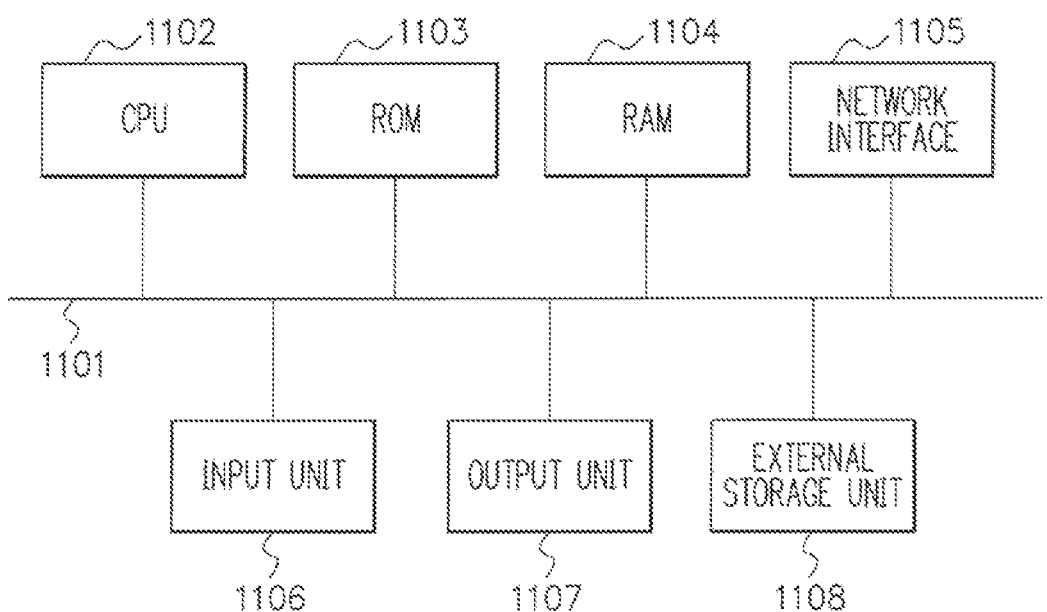
FIG. 11 is a block diagram illustrating a hardware configuration example of a computer constituting a designing device which performs designing of a semiconductor device.

FIG. 11 is a block diagram illustrating a hardware configuration example of a computer constituting a designing device which performs designing of a semiconductor device. This designing device can generate designing data of the semiconductor device by CAD (computer-aided design).

To a bus 1101 are connected a central processing unit (CPU) 1102, a ROM 1103, a RAM 1104, a network interface 1105, and input unit 1106, an output unit 1107, and an external storage unit 1109.

To a bus 1101 are connected a central processing unit (CPU) 1102, a ROM 1103, a RAM 1104, a network interface 1105, an input unit 1106, an output unit 1107, and an external storage unit 1109.

The CPU 1102 performs processing and calculation of data and controls the above-described constitution units connected via the bus 1101. The ROM 1103 stores a boot program in advance, and as a result that the CPU 1102 executes the boot program, the computer is activated. The external storage unit 1108 stores a computer program, and the computer program is copied to the RAM 1104 and executed by the CPU 1102. The computer can perform a later-described design processing of FIG. 12 or the like by executing the computer program.

The external storage unit 1108 is, for example, a hard disk storage unit or the like and a stored content is not deleted even if a power supply is cut off. The external storage unit 1108 can record a computer program, design data or the like in a storage medium, and can read the computer program or the like from the storage medium.

The network interface 1105 can input/output the computer program, the design data, or the like into/from a network. The input unit 1106 is, for example, a keyboard and a pointing device (mouse) or the like, and can perform various designation, input, or the like. The output unit 1107 is a display, a printer, or the like and can display or print.

The present embodiment can be realized as a result that the computer executes the program. Further, means for supplying a program to a computer, for example, a computer-readable storage medium such as a CD-ROM which stores that program, can be applied as an embodiment. Further, a computer program product such as a computer-readable storage medium which stores the above-described program can be also applied as an embodiment. The above-described program, storage medium, and computer program product are included in a range of the present embodiments. As the storage medium, for example, a flexible disk, a hard disk, an optical disk, a magnetic-optical disk, a CD-ROM, a magnetic tape, a non-volatile memory card, a ROM, or the like can be used.

Figure 12:
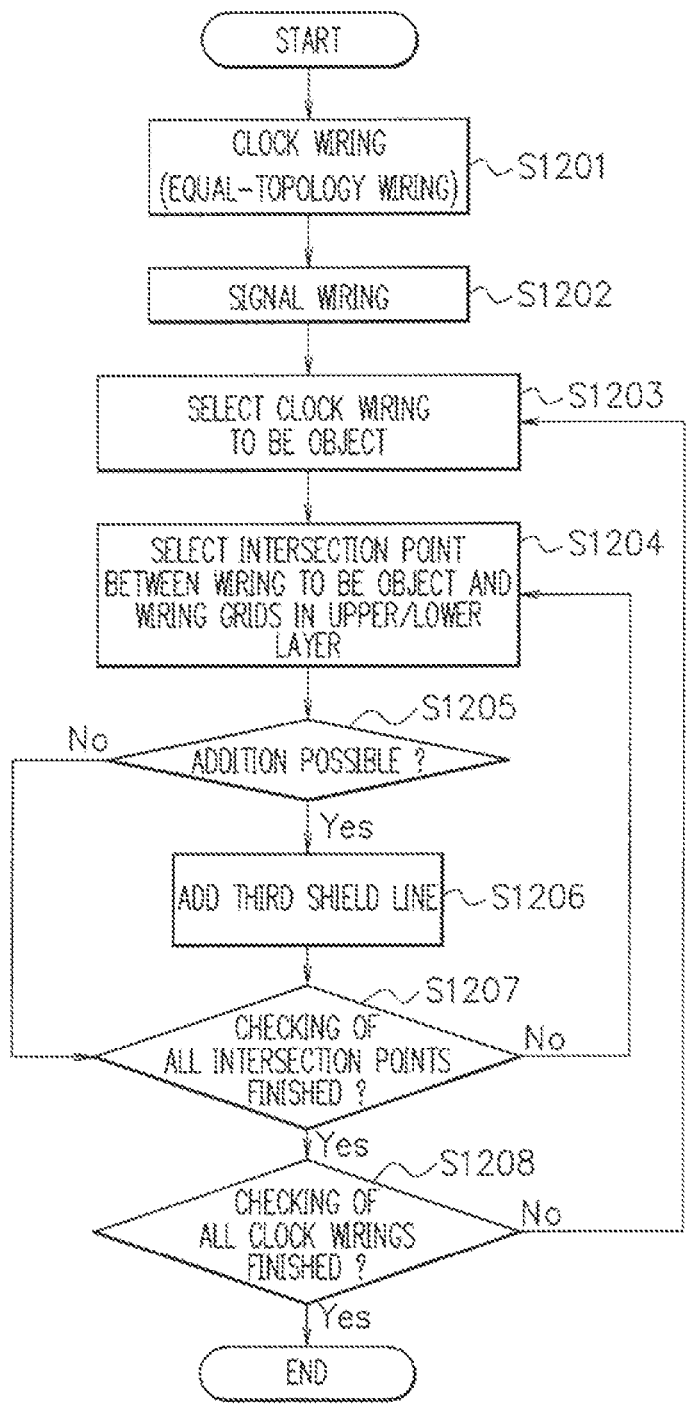
FIG. 12 is a flowchart illustrating a processing example of a designing method of the designing device of FIG. 11.
Figure 13:
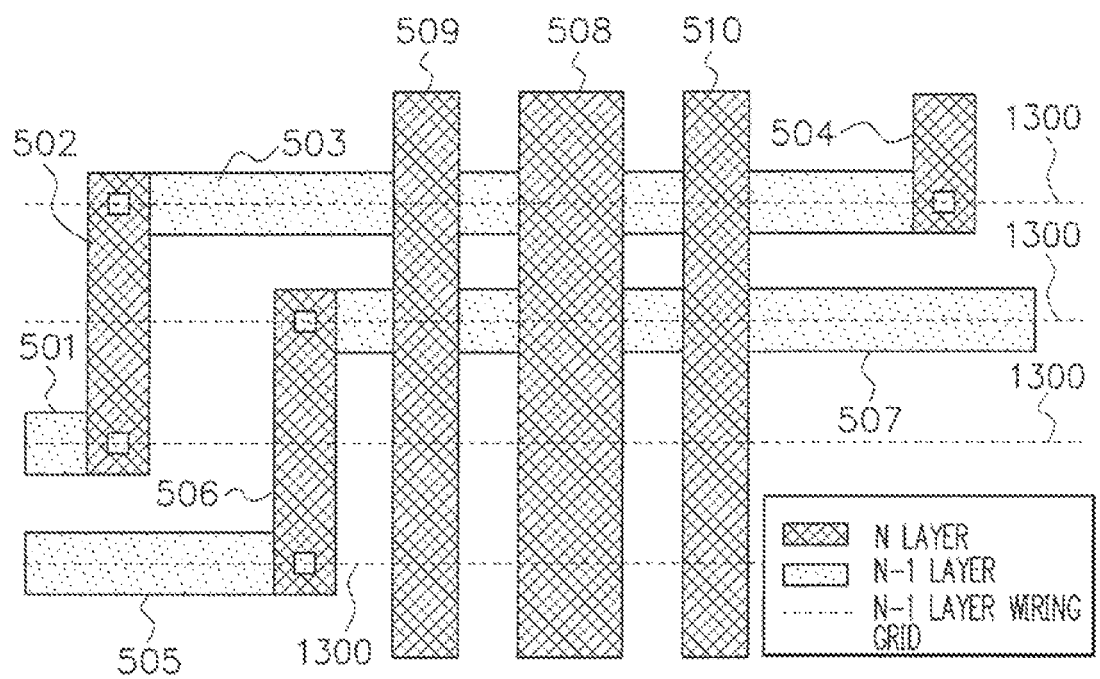
FIG. 13 is a diagram in which a wiring grid is added to FIG. 5.

FIG. 12 is a flowchart illustrating a processing example of a designing method of the designing device of FIG. 11. The designing device performs a design processing of the semiconductor devices of FIG. 7 and FIG. 9, generates design data, and stores in the external storage unit 1108. FIG. 13 is a diagram in which a wiring grid 1300 is added to FIG. 5. The wiring grids 1300 are grids indicating a minimum wiring interval on a design rule in a second wiring layer (N−1 layer).

First, in a step S1201, a designing device disposes a first signal line (clock signal line) 508 in a first direction in a first wiring layer (N layer), as illustrated in FIG. 13. For example, the designing device disposes clock signal lines 103 of equal-topology wirings such as H-trees in FIG. 2. Next, the designing device disposes a first shield line 509 and a second shield line 510 on both sides of the first signal line 508 in the first direction in the first wiring layer (N layer).

Next, in a step S1202, the designing device disposes signal lines 501 to 507 as illustrated in FIG. 13. The signal lines 501, 504 and 506 are disposed in the first direction in the first wiring layer (N layer). The signal lines 501, 503, 505, and 507 are disposed in a second direction in the second wiring layer (N−1 layer). The second signal lines 503 and 507 partially overlap with each of the first signal line 508, the first shield line 509, and the second shield line 510.

Next, in a step S1203, the designing device selects the first signal line (clock signal line) 508 to be an object among a plurality of the first signal lines (clock signal lines), one by one in sequence. For example, the first signal line (clock signal line) 508 of FIG. 13 is selected.

Next, in a step S1204, the designing device selects an intersection point between the wiring grids 1300 of an N+1 layer above the first signal line (clock signal line; 508 to be the object as well as an N−1 layer therebelow and the first signal line (clock signal line) 508 to be the object, one by one in sequence. For example, first, the intersection point between the top wiring grid line 1300 of FIG. 13 and the first signal line (clock wiring) 508 is selected.

Next, in a step S1205, the designing device checks whether or not a third shield line 701 is able to be added to the selected intersection point. For example, since the second signal line 503 is disposed at the intersection point between the top wiring grid line 1300 of FIG. 13 and the first signal line (clock wiring) 508, it is judged that the third shield line 701 is not able to be added. If the third shield line 701 is not able to be added, the process proceeds to a step S1207, and if the third shield line 701 is able to be added, the process proceeds to a step S1206.

In the step S1207, the designing device judges whether or not checking of all the intersection points is finished. If checking is not finished, the process returns to the step S1204, and if checking is finished, the process proceeds to a step S1208.

Next, the process returning to the step S1204, the designing device selects the intersection point between the second wiring grid 1300 from the top of FIG. 13 and the first signal line (clock signal line) 508. Next, in the step S1205, since the second signal line 507 is disposed at that intersection point, the designing device judges that the third shield line 701 is not able to be added.

Next, the process returning to the step S1204, the designing device selects the intersection point between the third wiring grid 1300 from the top of FIG. 13 and the first signal line (clock signal line) 508. Next, in the step S1205, since the second signal line is not disposed at that intersection point, the designing device judges that the third shield line 701 is able to be added, and the process proceeds to the step S1206.

Figure 14:
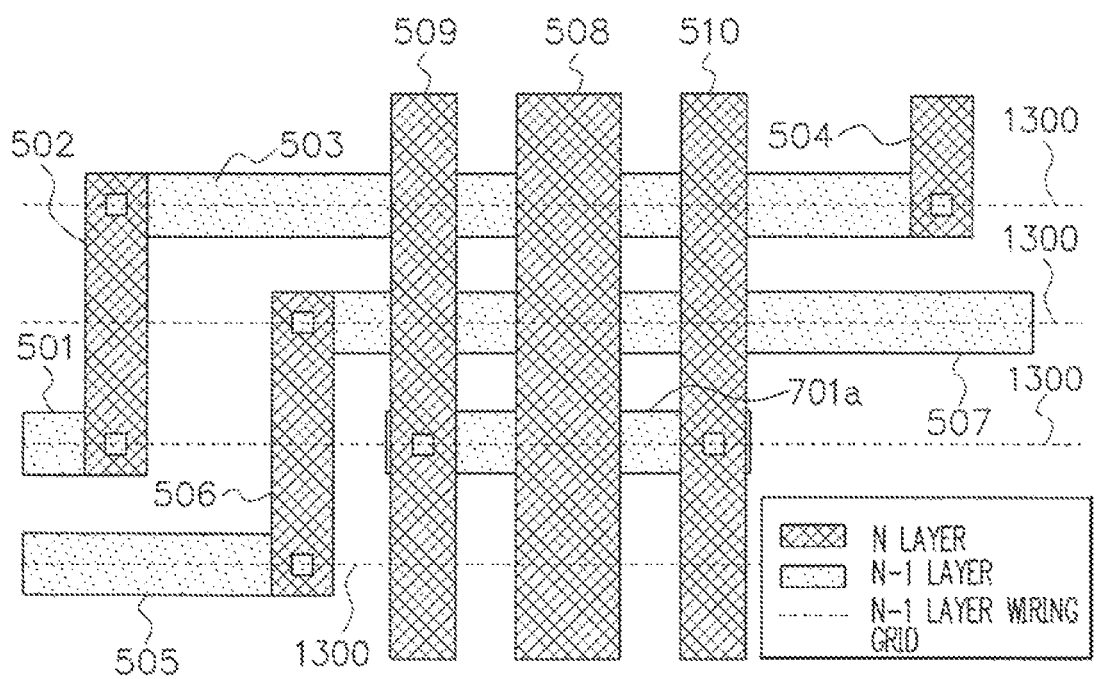
FIG. 14 is a plan view of a wiring layer.

In the step S1206, the designing device, as illustrated in FIG. 14, disposes a third shield line 701a in the second direction at the intersection point in the second wiring layer (N−1 layer), and connects the third shield line 701a to the first shield line 509 and the second shield line 510 by contacts.

Next, the process returning to the step S1204, the designing device selects the intersection point between the forth wiring grid 1300 from the top of FIG. 14 and the first signal line (clock signal line) 508. Next, in the step S1205, since the second signal line is not disposed at that intersection point, the designing device judges that the third shield line 701 is able to be added, and the process proceeds to the step S1206.

Figure 15:
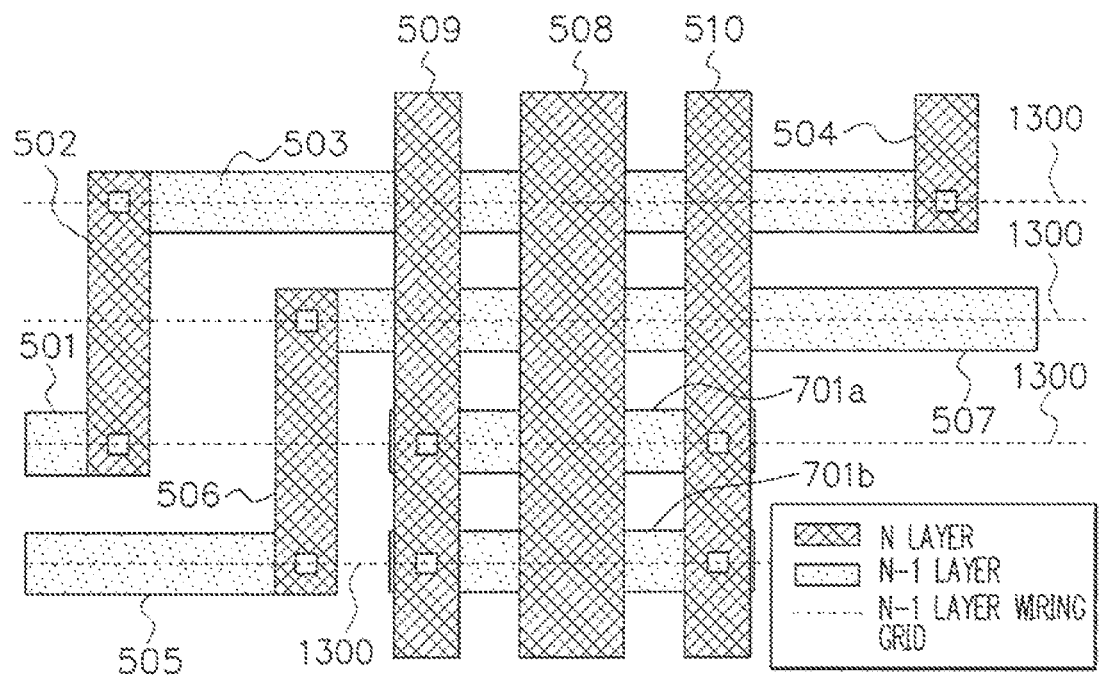
FIG. 15 is a plan view of a wiring layer.

In the step S1206, the designing device, as illustrated in FIG. 15, disposes a third shield line 701b in the second direction at the intersection point in the second wiring layer (N−1 layer), and connects the third shield line 701b to the first shield line 509 and the second shield line 510 by contacts.

Next, in the step S1207, when the designing device judges that checking of all the intersection points is finished, the process proceeds to the step S1208. In the step S1208, the designing device judges whether or not checking of all the first signal lines (clock signal lines) is finished. If checking is not finished, the process returns to the step S1203 and the next first signal line (clock signal line) is selected, and the above-described processings are repeated. If checking is finished, the processing of FIG. 12 is finished.

As described above, the designing device disposed the third shield line 701 in the region in which the second signal line is not disposed, on the wiring grid 1300.

Figure 16:
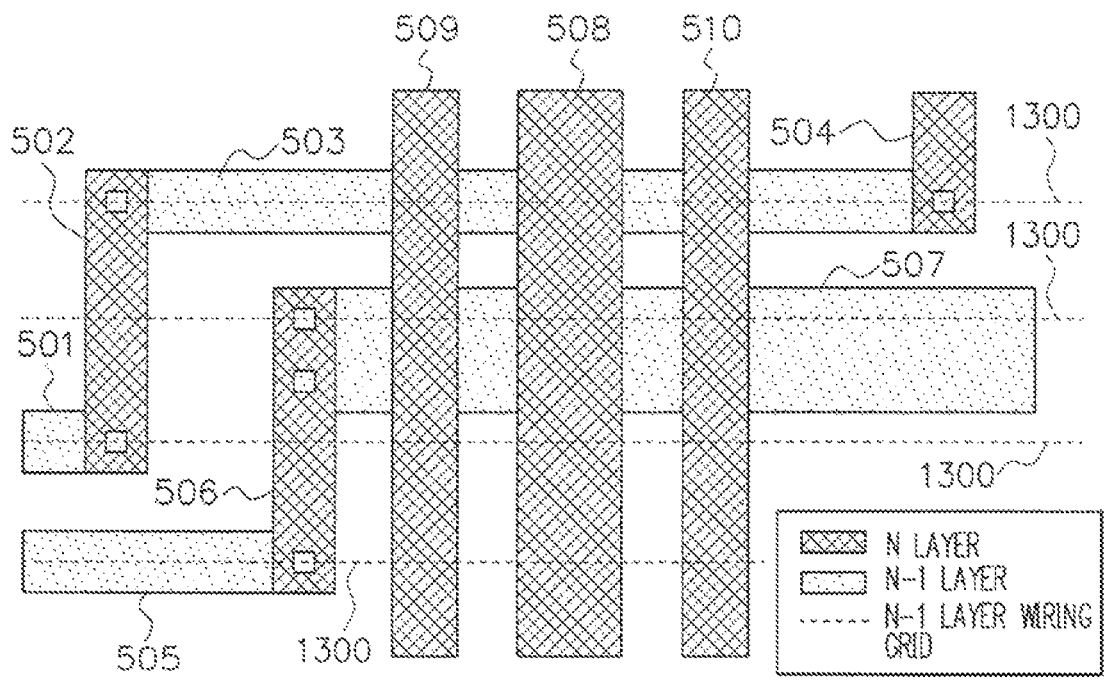
FIG. 16 is a plan view of a wiring layer in a case where a width of a second signal line is larger than that in the semiconductor device of FIG. 13.

FIG. 16 is a plan view of a wiring layer in a case where a width of a second signal line 507 is larger than in the semiconductor device of FIG. 13. In such a case, if a third shield line 701 is intended to be provided on a third wiring grid 1300 from the top of FIG. 16, a gap between the third shield line 701 and the second signal line 507 becomes too narrow, not fulfilling the design rule, so that the third shield line 701 is not able to be disposed.

Figure 17:
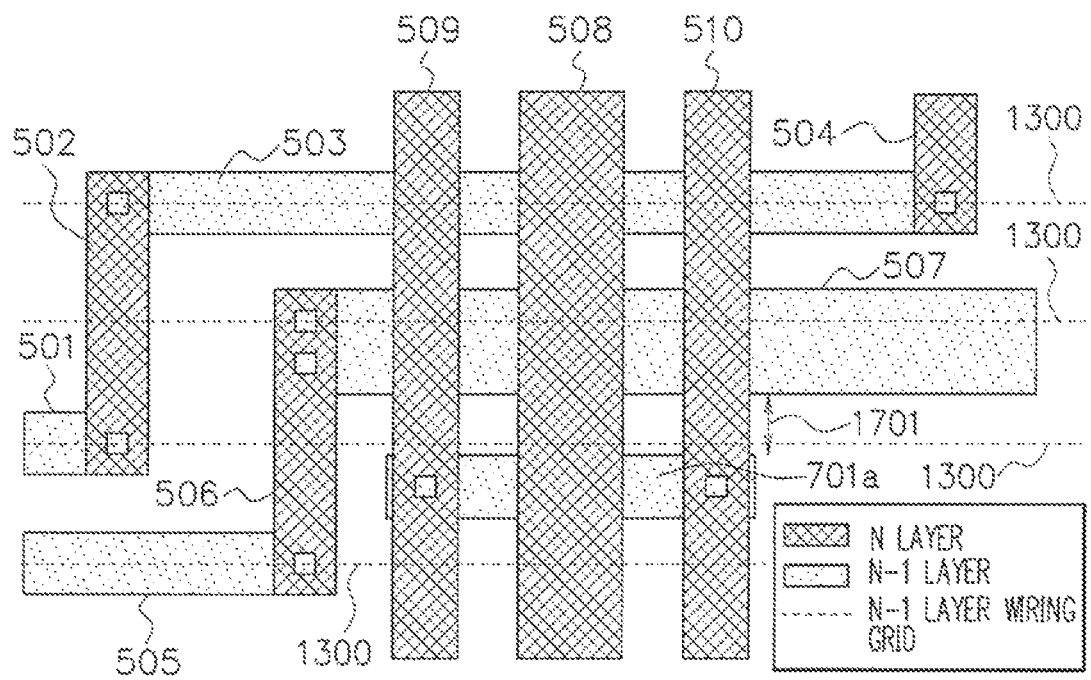
FIG. 17 is a plan view of a wiring layer.
Figure 18:
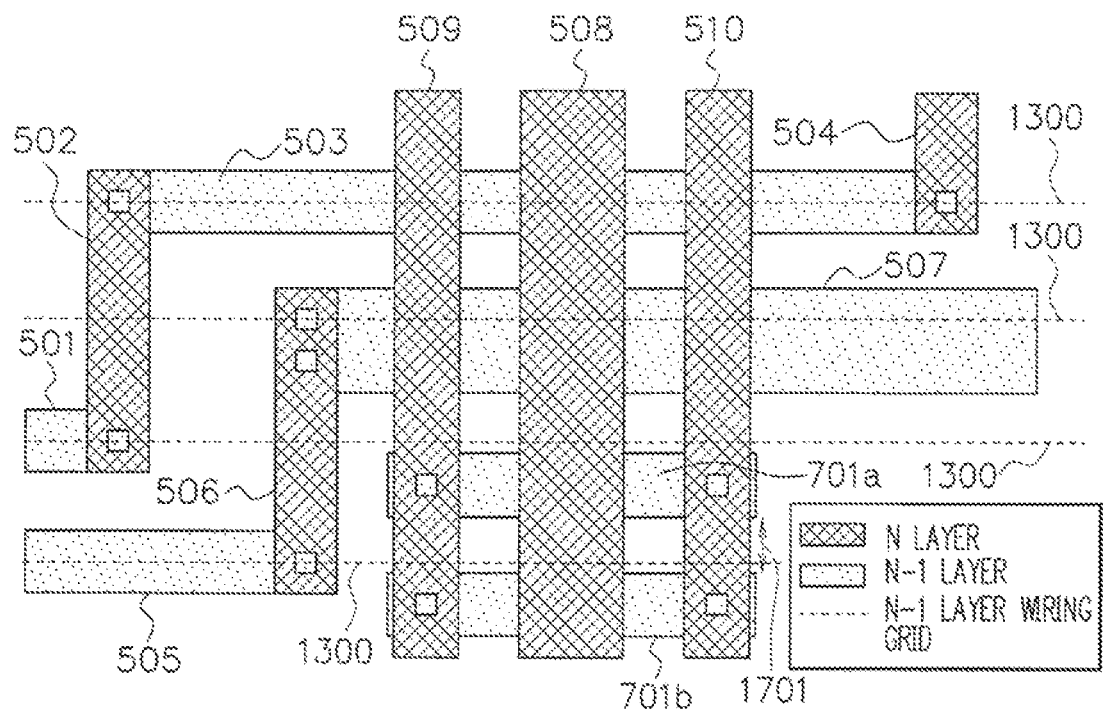
FIG. 18 is a plan view of a wiring layer.

In such a case, as illustrated in FIG. 17, a third shield line 701a is disposed at a first wiring interval 1701 which fulfils the design rule in relation to the second signal line 507. Thereafter, as illustrated in FIG. 18, a third shield line 701b is disposed at the first wiring interval 1701 in relation in the third shield line 701a. Thereby, the third shield lines 701a and 701b are disposed with the first wiring width and at the first wiring interval 1701.

Incidentally, also in a case where a second signal line 507 is not on a wiring grid 1300, it suffices if third shield lines 701a and 701b are disposed at the first wiring interval 1701 similarly to in FIG. 17 and FIG. 18.

FIG. 19 is a flowchart illustrating a processing example of a case where a result of timing violation is obtained from timing analysis of a semiconductor device of FIG. 20. In such a case, in order to solve the timing violation, it is necessary to modify the clock signal line and/or the signal line by a processing of FIG. 19.

FIG. 20 is diagram of signal lines 2001 to 2003 provided in stead of the signal lines 501 to 507 for the semiconductor device of FIG. 15. The signal lines 2001 to 2003 are connected to each other by contacts. The signal line 2001 is disposed in a first direction in a third wiring layer (N−2 layer). The signal line 2002 is disposed in a second direction in a second wiring layer (N−1 layer). The signal line 2003 is disposed in the first direction in a first wiring layer (N layer). The second signal line 2002 partially overlaps with each of a first signal line 508, a first shield line 509, and a second shield line 510. A third shield line 701 is disposed in a region in which the second signal line 2002 does not exist at an intersection point between a wiring grid 1300 and the first signal line 508.

Figure 21:
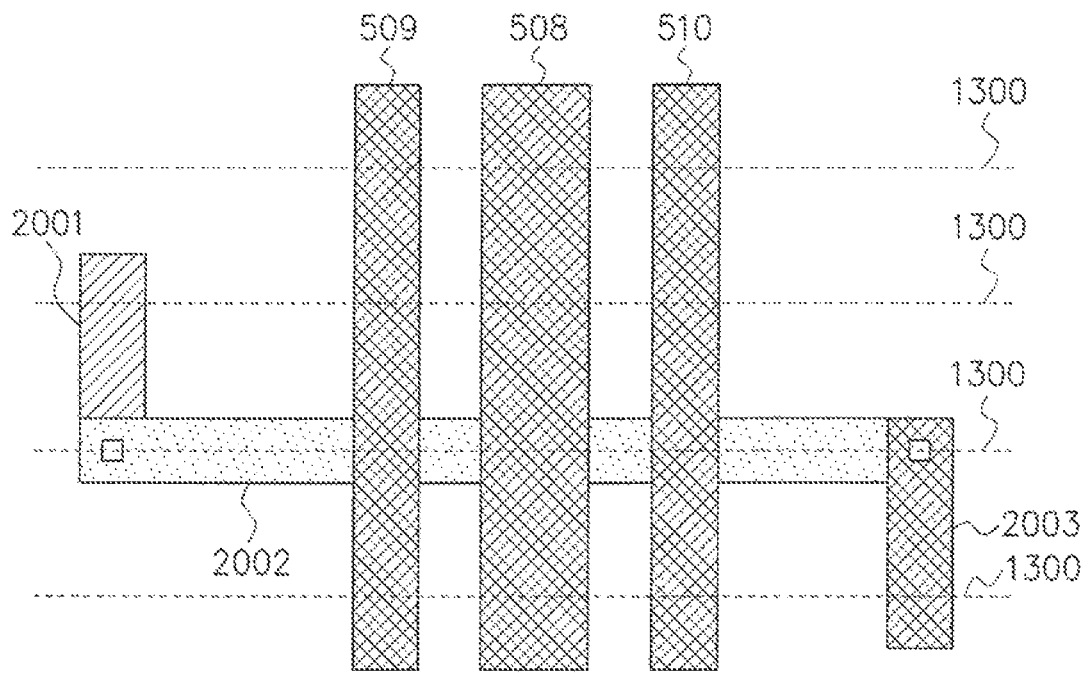
FIG. 21 is a plan view of a wiring layer.

In a step S1901 of FIG. 19, the designing device deletes all the third shield lines 701 in the semiconductor device of FIG. 20 and generates a wiring layer of a semiconductor device of FIG. 21.

Next, in a step S1902, the designing device amends logical design data of the semiconductor device of FIG. 21 so that timing violation can be solved.

Figure 22:
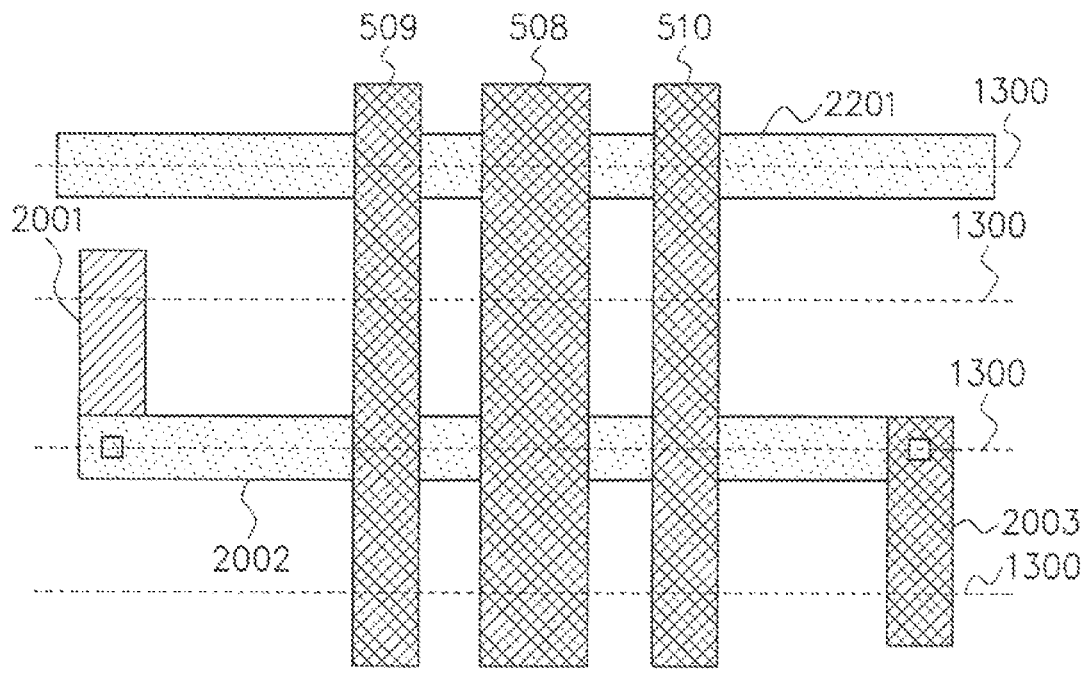
FIG. 22 is a plan view of a wiring layer.

Nest, in a step S1903, the designing device amends a wiring according to layout design, in correspondence with above-described amendment of the logical design data. For example, the designing device disposes a signal line 2201 in the second direction in the second wiring layer (N−1 layer), as illustrated in FIG. 22.

Figure 23:
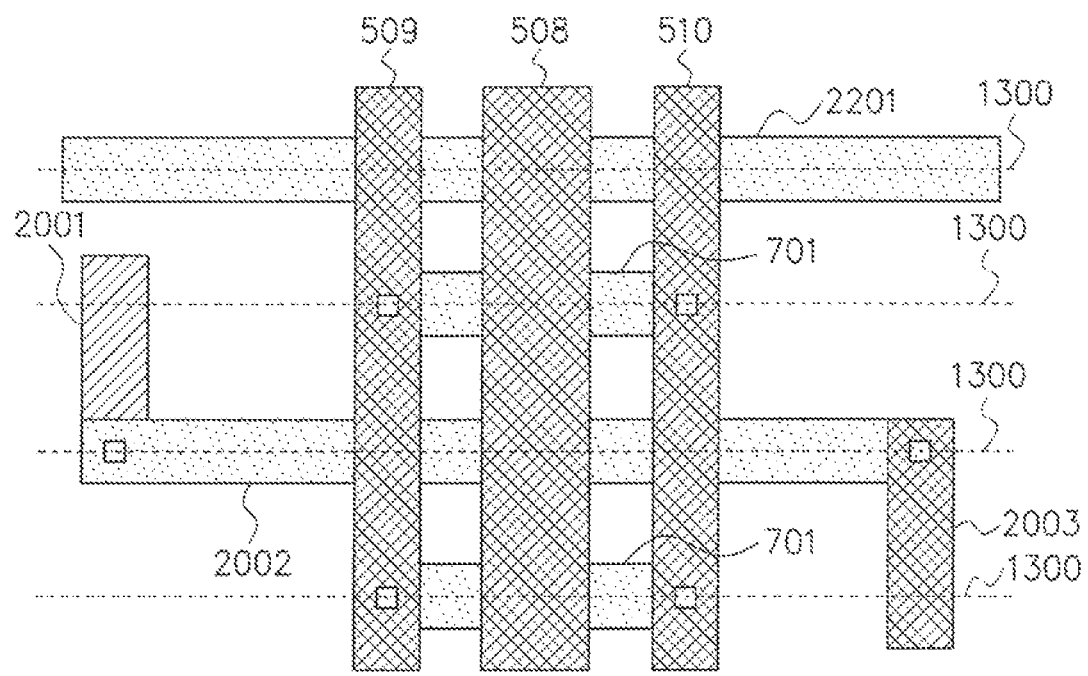
FIG. 23 is a plan view of a wiring layer.

Next, in a step S1904, the designing device performs an insertion processing of a third shield line 701 as illustrate din FIG. 23. A processing of the step S1904 is the same processing as the processing of FIG. 12. For example, the designing device disposes the third shield line 701 in a region in which second signal lines 2201 and 2002 are not disposed at the intersection point between the wiring grid 1300 and the first signal line 508, and connects the third shield line 701 to the first shield line 509 and the second shield line 510 by contacts. Then, the processing of FIG. 19 is finished.

Figure 24:
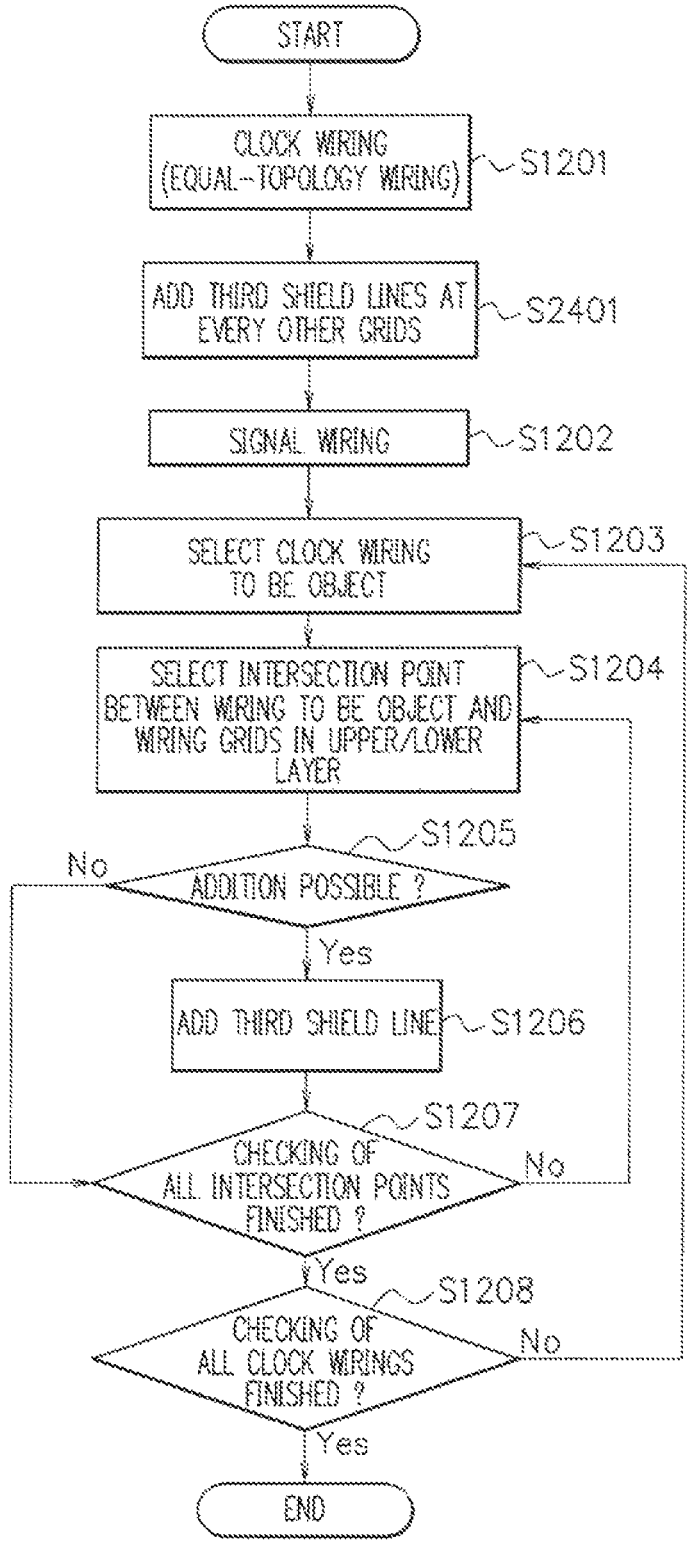
FIG. 24 is a flowchart illustrating a processing example of a designing method of a semiconductor device according to another embodiment.

FIG. 24 is a flowchart illustrating a processing example of a designing method of a semiconductor device according to another embodiment, in which a step S2401 is added to the flowchart of FIG. 12. Hereinafter, a point in which the processing of FIG. 24 differs from the processing of FIG. 12 will be described. The processing of FIG. 24 can further improve uniformity of wirings in relation to the processing of FIG. 12.

In a step S1201, a designing device disposes a first signal line 508, a first shield line 509, and a second shield line 510, as illustrated in FIG. 23.

Figure 25:
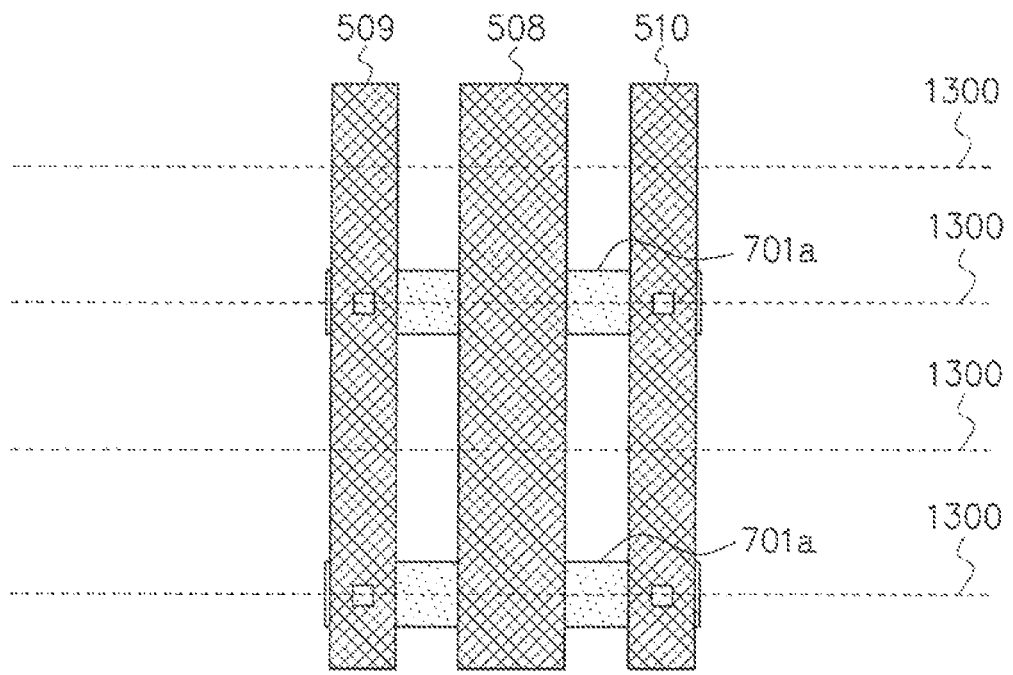
FIG. 25 is a plan view of a wiring layer.

Next, in a step S2401, the designing device disposes third shield lines 701a in a second direction in a second wiring layer (N−1 layer) at every other grid on wiring grids 1300 as illustrated in FIG. 25, and connects the third shield lines 701a to a first shield line 509 and a second shield line 510 by contacts.

Figure 26:
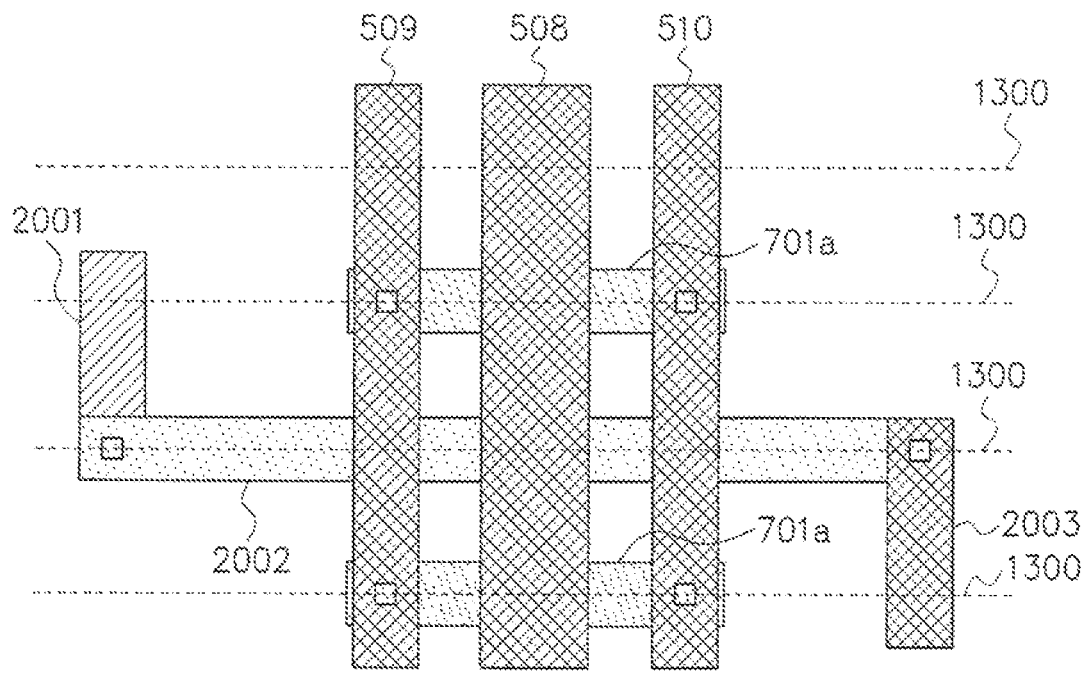
FIG. 26 is a plan view of a wiring layer.

Next, in a step S1202, the designing device disposes signal lines 2002 to 2003 as illustrate in FIG. 26.

Figure 27:
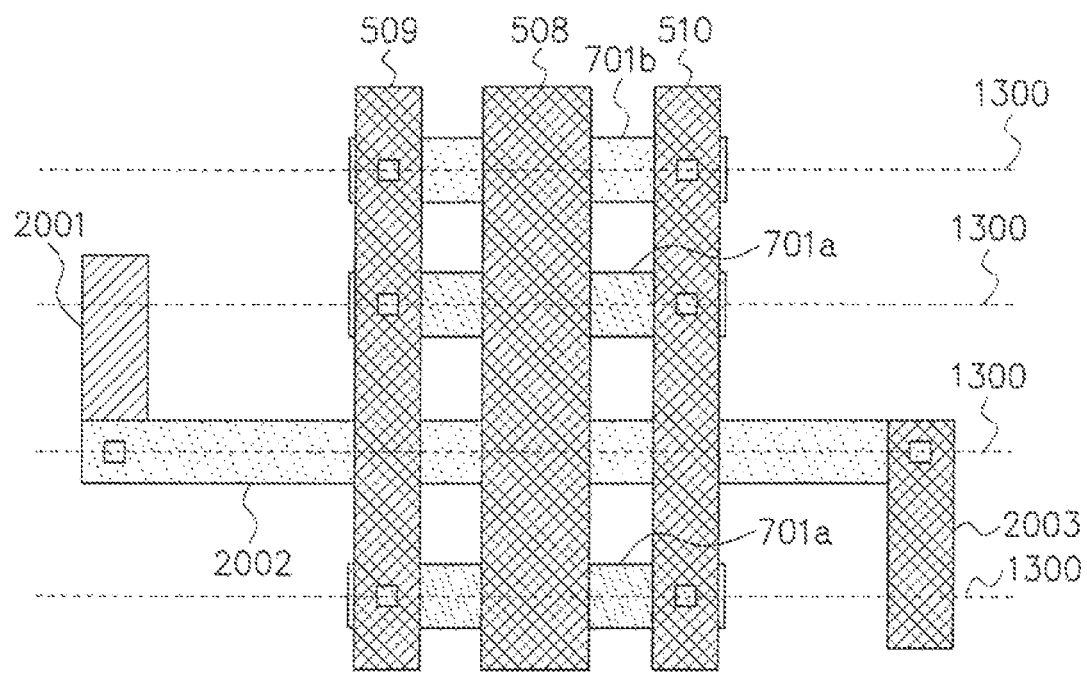
FIG. 27 is a plan view of a wiring layer.

Next, the process proceeding to a step S1206 via steps S1203 to S1205, the designing device disposes a third shield line 701b in a region in which the wirings 2002, 701a are not disposed at an intersection point between the wiring grid 1300 and the first signal line 508, in the second direction in the second wiring layer (N−1 layer), as illustrated in FIG. 27. Other processings are similar to the processing of FIG. 12.

In the present embodiment, third shield lines 701a are disposed at every other grid before the signal lines 2001 to 2003 are wired. Thereby, disposition of the second signal line 2002 of the second wiring layer (N−1 layer) below the first signal line 508 is guided to an empty region. Next, the signal lines 2001 to 2003 are disposed. Thereafter, the third shield line 701b is disposed in the region in which the wirings 2002, 701a, are not disposed at the intersection point between the wiring grid 1300 and the first signal line 508. Thereby, wirings in the second wiring layer (N−1 layer) below the first signal line 508 can be maintained uniform. For the step S2401, an example in which the third shield lines 703a are disposed at every other grid is described, and hereinafter, an example in which third shield lines 701a are disposed at every N (natural number) grids will be described.

First, with reference to FIG. 28 to FIG. 30, a case where a second signal line 2902 is disposed off a wiring grid 1300 as in FIG. 29 will be described.

Figure 28:
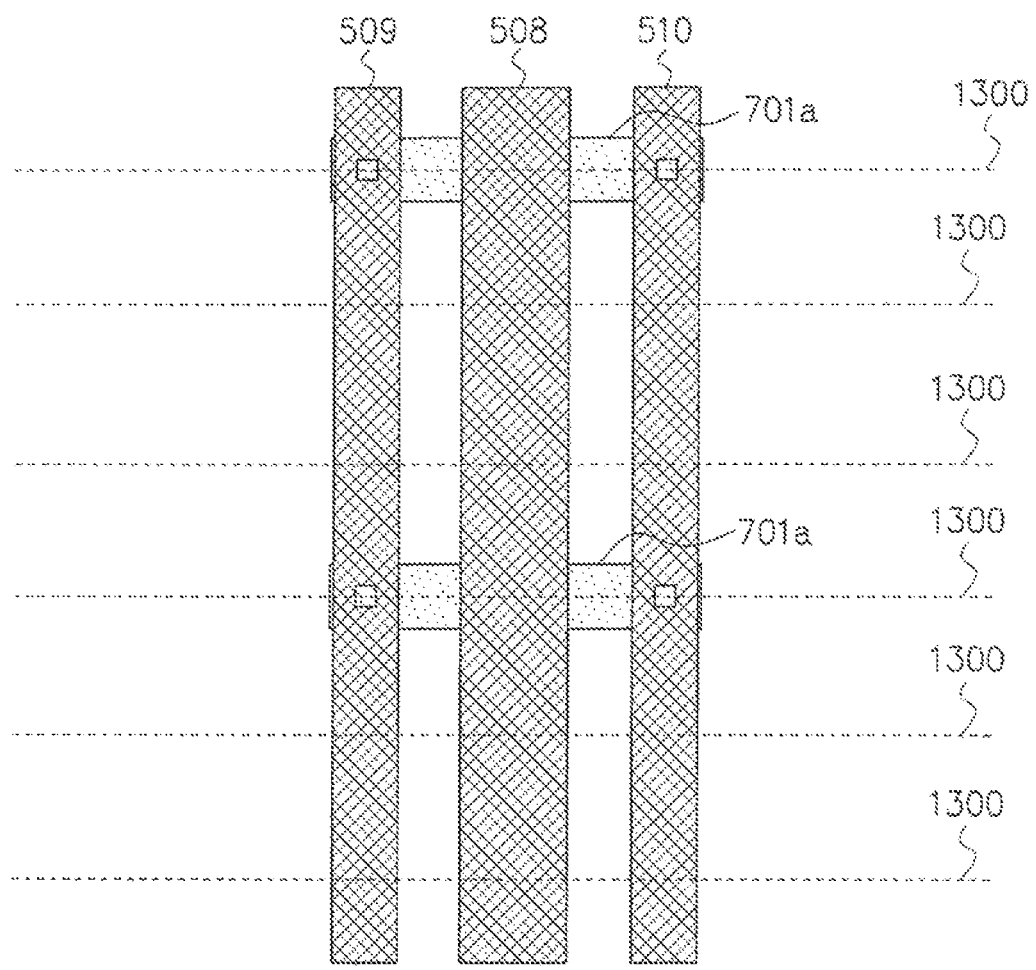
FIG. 28 is a plan view of a wiring layer.

In a step S1201, a designing device disposes a first signal line 508, a first shield line 509, and a second shield line 510 as illustrated in FIG. 28.

Next, in a step S2401, the designing device disposes third signal lines 701a at every two grids on the wiring grids 1300.

Next, in a step S1202, the designing device disposes signal lines 2901 to 2903 as illustrated in FIG. 29. The second signal line 2902 is disposed off the wiring grid 1300.

Next, in a step S1205, the designing device judges that a third shield wiring 701 is not able to be added since the second wiring grid 1300 and the third wiring grid 1300 from the top of FIG. 29 have too narrow gaps between the second signal line 2902, not fulfilling the design rule. Further, the designing device judges that the third shield line 701 is not able to be added since the third shield lines 701a are disposed at the first and fourth wiring grids 1300 from the stop of FIG. 29.

Next, in a step S1206, the designing device adds third shield lines 701b on fifth and sixth wiring grids 1300 from the top of FIG. 30. As described above, by disposing the third shield lines 701a and 701b, a skew and a cross talk can be reduced.

Next, with reference to FIG. 31 to FIG. 33, a case where a second signal line 3202 with a large width is disposed as in FIG. 32 will be described.

In a step S1201, a designing device disposes a first signal line 508, a first shield line 509, and a second shield line 510 as illustrated in FIG. 31.

Next, in a step S2401, the designing device disposes third shield lines 701a at three other grids, on the wiring grids 1300.

Figure 32:
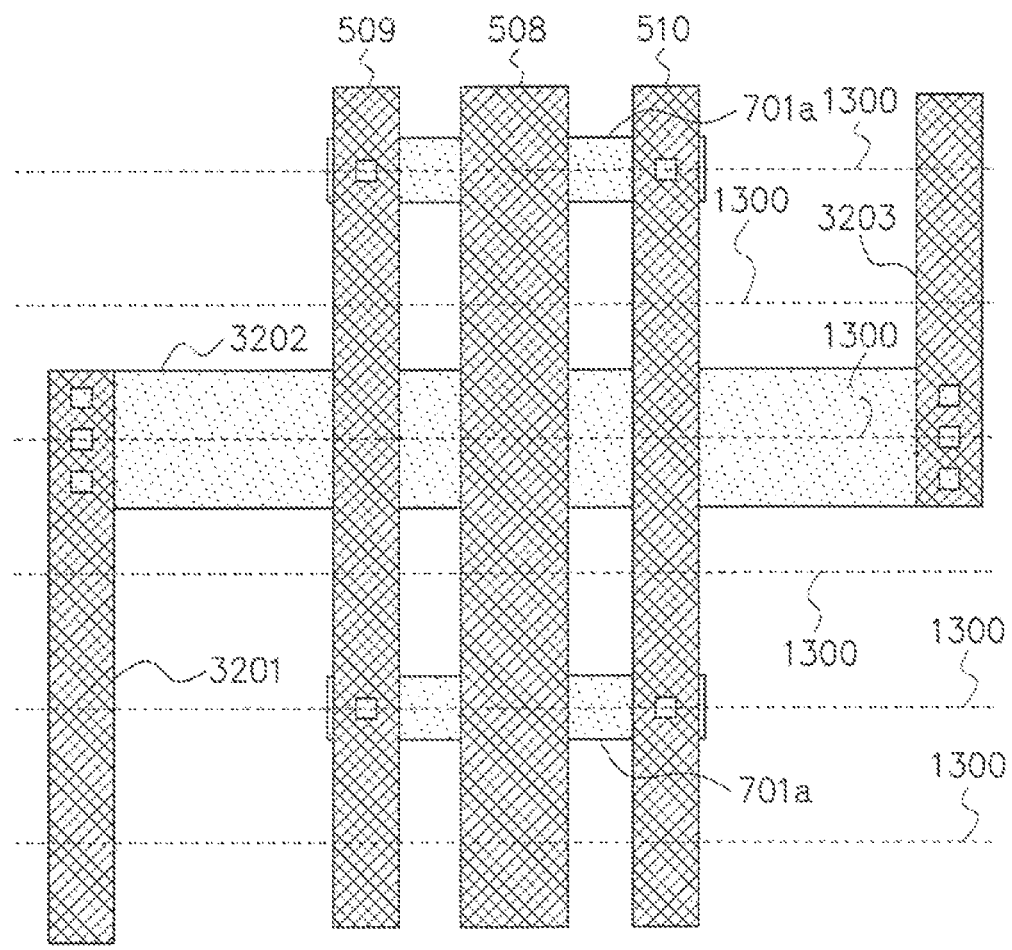
FIG. 32 is a plan view of a wiring layer.
Figure 33:
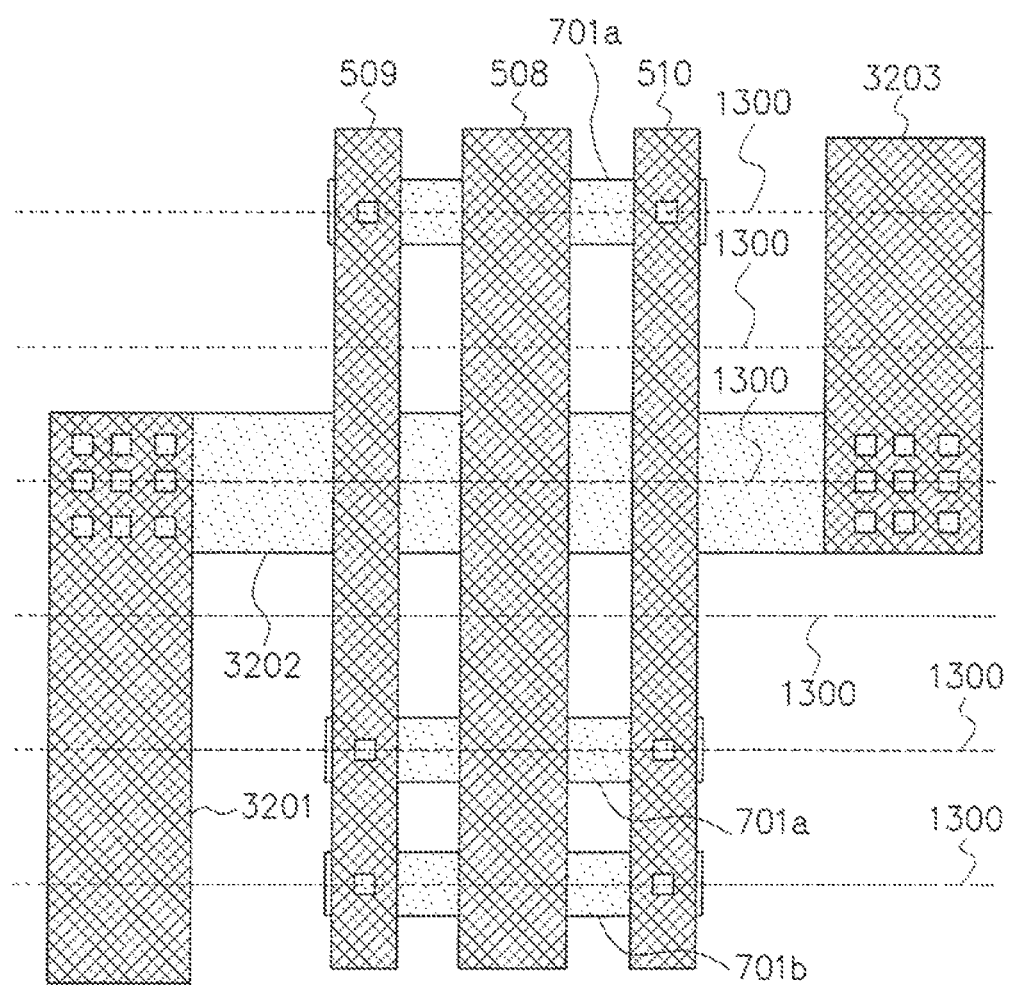
FIG. 33 is a plan view of a wiring layer.

Next, in a step S1202, the designing device disposes signal lines 3201 to 3203 as illustrated in FIG. 32. The second signal line 3202 has a width larger than a width of the first wiring.

Next, in a step S1205, the designing device judges that a third shield wiring 701 is not able to be added since the second and forth wiring grids 1300 from the top of FIG. 12 have too narrow gaps between the second signal line 3202, not fulfilling the design role. Further, the designing device judges that the third shield line 701 is not able to be added since the wirings 701a and 3202 are disposed at the first, third, and fifth wiring grids 1300 from the top of FIG. 32.

Next, in a step S1206, the designing device adds a third shield line 701b on the sixth wiring grid 1300 from the top of FIG. 32. As described above, by disposing the third shield lines 701a and 701b, a skew and a cross talk can be reduced.

According to the above-described various embodiments, by adding the third shield lines 701 to the lower layer and/or the upper layer of the first signal line 508, uniformity of capacitances is heightened and a cross talk can be reduced. As a result, a variation in delay times of the clock signals of the first signal lines 508 can be reduced, so that a skew can be made smaller.

In the above-described various embodiments, by unifying surrounding layout patterns of the first signal line 508 without increasing wiring layers, uniformity of adjacent wiring capacitances can be done, and as a result, a clock skew can be made smaller. More specifically, it is possible to unify capacitances of the first signal lines 508 and make an influence of a cross talk from a wiring of two-layer below and/or two-layer above, without aggravating a wiring property of a signal line of upper or lower layer.

The above-described embodiments only illustrate concrete examples for carrying out the present invention, and the technical scope of the present invention should not be construed in a limited manner by these embodiments. That is, the present invention can be embodied in various forms without departing from its technical idea or its main features.

By providing a plurality of third shield lines, a variation in delay times of signals of first signal lines can be prevented, a skew can be reduced, and a cross talk can be reduced.

All examples and conditional language provided herein are intended for the pedagogical purposed of aiding the reader in understanding the invention and the concepts contributed by the inventor to further the art, and are not to be construed as limitations to such specifically recited examples and conditions, nor does the organization of such examples in the specification related to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A method of designing a semiconductor device, to be executed by a computer, the method comprising:
    disposing, by the computer, first and second shield lines on both sides of a first signal line in a first direction in a first wiring layer;
    setting, by the computer, a plurality of wiring grid regions partially intersecting with each of the first signal line and the first and second shield lines with a predetermined wiring width and at a predetermined wiring interval in a second direction almost orthogonal to the first direction in a second wiring layer;
    detecting, by the computer, whether a second signal line to be set by the computer exists in the wiring grid regions;
    disposing, by the computer, a third shield line at a portion of the wiring grid region in which the second signal line has not been detected to be present by the computer; and
    connecting, by the computer, the third shield line disposed by the computer and the first and second shield lines by using vias.

2. A method of designing a semiconductor device, to be executed by a computer, the method comprising:
    disposing, by the computer, first and second shield lines on both sides of a first signal line in a first direction in a first wiring layer;
    setting, by the computer, a plurality of wiring grid regions partially intersecting with each of the first signal line and the first and second shield lines with a predetermined wiring width and at a predetermined wiring interval in a second direction almost orthogonal to the first direction in a second wiring layer;
    detecting, by the computer, whether a second signal line to be set by the computer exists in the wiring grid regions;
    disposing, by the computer, a third shield line at a portion of the wiring grid region in which the second signal line has not been detected to be present by the computer;
    connecting, by the computer, the third shield line disposed by the computer and the first and second shield lines by using vias;
    deleting, by the computer, the third shield line in a case of a timing violation according to timing analysis of the semiconductor device;
    disposing, by the computer, a third signal line in the second direction in the second wiring layer in order to solve the timing violation;
    detecting, by the computer, whether the second signal line or the third signal line exists in the wiring grid regions;
    disposing, by the computer, a fourth shield line at a portion of the wiring grid region in which neither the second signal line nor the third signal line has been detected to be present by the computer; and
    connecting, by the computer, the fourth shield line disposed in the wiring grid region and the first and second shield lines by contacts.

3. A method of designing a semiconductor device, to be executed by a computer, the method comprising:
    disposing, by the computer, first and second shield lines on both sides of a first signal line in a first direction in a first wiring layer;
    setting, by the computer, a plurality of wiring grid regions partially intersecting with each of the first signal line and the first and second shield lines with a predetermined wiring width and at a predetermined wiring interval in a second direction almost orthogonal to the first direction in a second wiring layer;
    disposing, by the computer, a third shield line in every n-th wiring grid region/regions;
    disposing, by the computer, a second signal line in the second direction in the second wiring layer;
    detecting, by the computer, whether the second signal line or the third shield line exists in the wiring grid regions; and
    disposing, by the computer, a fourth shield line at a portion of the wiring grid region in which neither the second signal line nor the third shield line has been detected to be present by the computer.

* * * * *